(12) United States Patent
Saida et al.

(10) Patent No.: US 9,025,368 B2
(45) Date of Patent: May 5, 2015

(54) MAGNETIC MEMORY ELEMENT AND NONVOLATILE MEMORY DEVICE

(71) Applicant: Kabushiki Kaisha Toshiba, Minato-ku (JP)

(72) Inventors: Daisuke Saida, Tokyo (JP); Minoru Amano, Kanagawa-ken (JP); Hiroshi Imamura, Ibaraki-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/184,920

(22) Filed: Feb. 20, 2014

(65) Prior Publication Data

US 2014/0269037 A1   Sep. 18, 2014

(30) Foreign Application Priority Data

Mar. 13, 2013   (JP) ................. 2013-050910

(51) Int. Cl.
   *G11C 11/00*   (2006.01)
   *H01L 43/02*   (2006.01)
   *G11C 11/16*   (2006.01)
   *H01L 43/08*   (2006.01)
   *H01L 27/22*   (2006.01)

(52) U.S. Cl.
   CPC .............. *H01L 43/02* (2013.01); *G11C 11/161* (2013.01); *H01L 43/08* (2013.01); *H01L 27/228* (2013.01)

(58) Field of Classification Search
   None
   See application file for complete search history.

(56) References Cited

U.S. PATENT DOCUMENTS

| | | | |
|---|---|---|---|
| 8,085,582 B2 | 12/2011 | Nakamura et al. | |
| 8,488,375 B2 | 7/2013 | Saida et al. | |
| 8,508,979 B2 | 8/2013 | Saida et al. | |
| 8,576,616 B2 | 11/2013 | Saida et al. | |
| 8,582,355 B2 | 11/2013 | Saida et al. | |
| 2009/0015958 A1 | 1/2009 | Nakamura et al. | |
| 2012/0068281 A1 | 3/2012 | Saida et al. | |
| 2012/0236633 A1 | 9/2012 | Saida et al. | |
| 2012/0241827 A1 | 9/2012 | Daibou et al. | |
| 2012/0243308 A1 | 9/2012 | Saida et al. | |
| 2013/0069185 A1 | 3/2013 | Saida et al. | |
| 2013/0070523 A1 | 3/2013 | Saida et al. | |
| 2013/0249024 A1 | 9/2013 | Saida et al. | |

FOREIGN PATENT DOCUMENTS

| | | |
|---|---|---|
| JP | 2012-64863 | 3/2012 |
| JP | 2012-69958 | 4/2012 |

OTHER PUBLICATIONS

U.S. Appl. No. 13/795,620, filed Mar. 12, 2013, Daisuke Saida, et al.

*Primary Examiner* — Kretelia Graham
(74) *Attorney, Agent, or Firm* — Oblon, McClelland, Maier & Neustadt, L.L.P.

(57) ABSTRACT

A magnetic memory element includes a first stacked unit and a second stacked unit. The first stacked unit includes a first ferromagnetic layer, a second ferromagnetic layer, and a first nonmagnetic layer. The second ferromagnetic layer is stacked with the first ferromagnetic layer. The second ferromagnetic layer has a first and second portion. The first and second portion has a changeable direction of magnetization. The second portion is stacked with the first portion in a stacking direction of the first ferromagnetic layer and the second ferromagnetic layer. A magnetic resonance frequency of the second portion is lower than a magnetic resonance frequency of the first portion. The first nonmagnetic layer is provided between the first ferromagnetic layer and the second ferromagnetic layer. The second stacked unit is stacked with the first stacked unit in the stacking direction. The second stacked unit includes a third ferromagnetic layer.

20 Claims, 23 Drawing Sheets

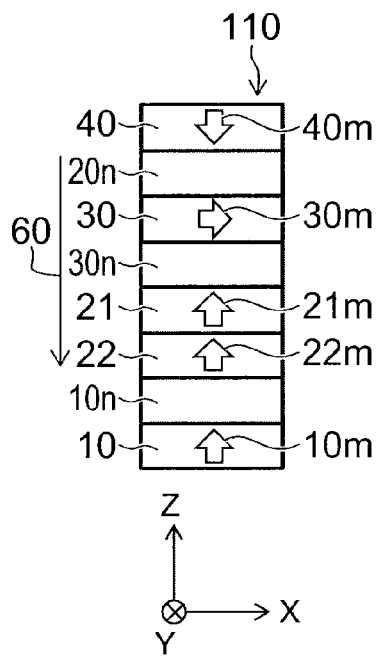 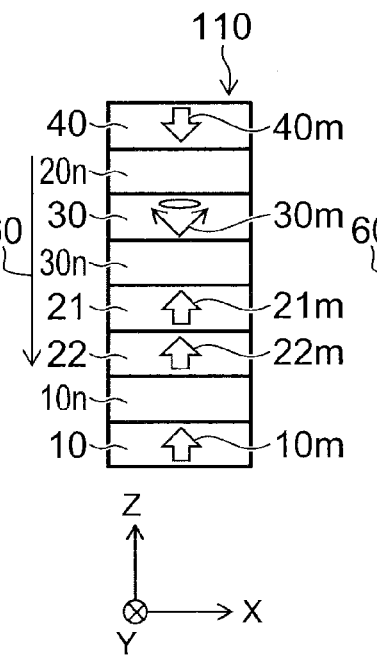 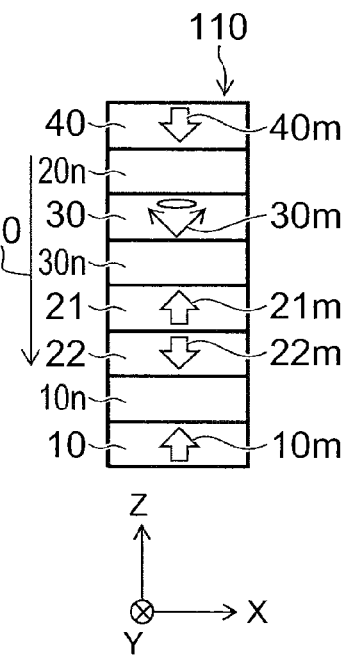
FIG. 3A    FIG. 3B    FIG. 3C
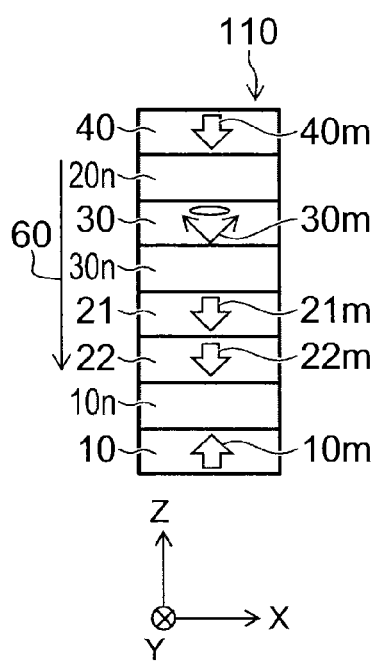 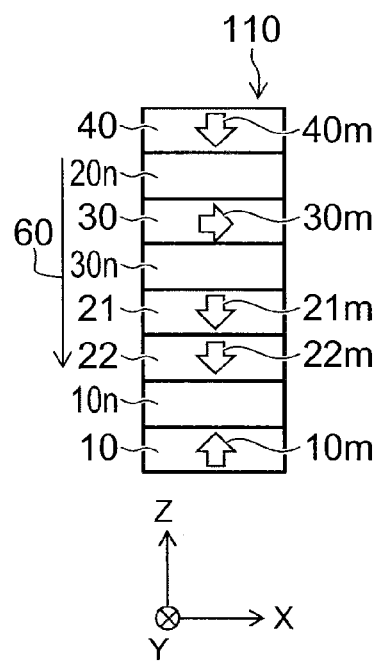
FIG. 3D    FIG. 3E

| t1 (nm) | Ms1 (emu/cc) | Ku1 (erg/cc) | H$_K$1 (kOe) | f1 (GHz) | Ic1 (µA) |
|---|---|---|---|---|---|
| 1 | 800 | 12M | 22 | 62 | 11 |

| t2 (nm) | Ms2 (emu/cc) | Ku2 (erg/cc) | H$_K$2 (kOe) | f2 (GHz) | Ic2 (µA) |
|---|---|---|---|---|---|
| 2 | 500 | 2.4M | 4.6 | 13 | 3.0 |

MAGNETIC MEMORY ELEMENT AND NONVOLATILE MEMORY DEVICE

CROSS-REFERENCE TO RELATED APPLICATIONS

This application is based upon and claims the benefit of priority from Japanese Patent Application No. 2013-050910, filed on Mar. 13, 2013; the entire contents of which are incorporated herein by reference.

FIELD

Embodiments described herein relate generally to a magnetic memory element and a nonvolatile memory device.

BACKGROUND

A configuration of magnetic random access memory (MRAM) has a data storage unit that uses a magnetic tunnel junction (MTJ) element that exhibits a tunneling magnetoresistive (TMR) effect. Such a configuration is drawing attention as a high-speed/large-capacity nonvolatile memory device. It is desirable to suppress misoperations in such a magnetic memory element and nonvolatile memory device.

BRIEF DESCRIPTION OF THE DRAWINGS

FIGS. 3A to 3E are schematic views showing operations of the nonvolatile memory device according to the first embodiment;

DETAILED DESCRIPTION

Figure 1:
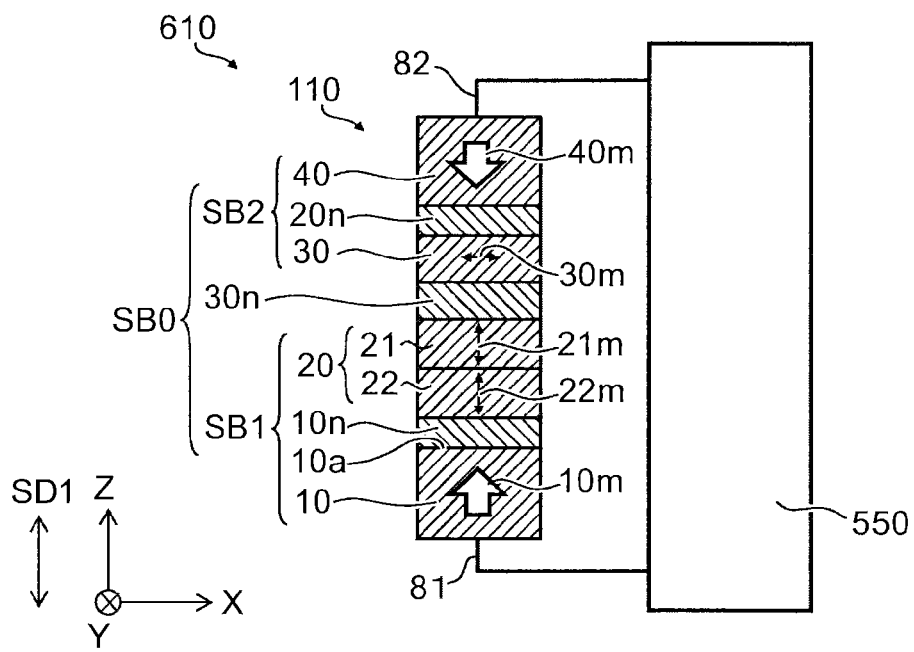
FIG. 1 is a schematic cross-sectional view showing a nonvolatile memory device according to a first embodiment.

According to one embodiment, a magnetic memory element includes a first stacked unit and a second stacked unit. The first stacked unit includes a first ferromagnetic layer, a second ferromagnetic layer, and a first nonmagnetic layer. The first ferromagnetic layer has a fixed direction of magnetization. The second ferromagnetic layer is stacked with the first ferromagnetic layer. The second ferromagnetic layer has a first portion and a second portion. The first portion has a changeable direction of magnetization. The second portion is stacked with the first portion in a stacking direction of the first ferromagnetic layer and the second ferromagnetic layer. The second portion has a changeable direction of magnetization. A magnetic resonance frequency of the second portion is lower than a magnetic resonance frequency of the first portion. The first nonmagnetic layer is provided between the first ferromagnetic layer and the second ferromagnetic layer. The second stacked unit is stacked with the first stacked unit in the stacking direction. The second stacked unit includes a third ferromagnetic layer having a changeable direction of magnetization. A rotating magnetic field is generated by a precession of the magnetization of the third ferromagnetic layer when a current flows in the first stacked unit and the second stacked unit in one of a direction from the first stacked unit toward the second stacked unit and a direction from the second stacked unit toward the first stacked unit. The direction of the magnetization of the first portion and the direction of the magnetization of the second portion is oriented in a direction corresponding to an orientation of the current due to actions of the rotating magnetic field and spin-polarized electrons.

According to another embodiment, a nonvolatile memory device includes a magnetic memory element, a first interconnect, a second interconnect, and a control unit. The magnetic memory element includes a first stacked unit and a second stacked unit. The first stacked unit includes a first ferromagnetic layer, a second ferromagnetic layer, and a first nonmagnetic layer. The first ferromagnetic layer has a fixed direction of magnetization. The second ferromagnetic layer is stacked with the first ferromagnetic layer. The second ferromagnetic layer has a first portion and a second portion. The first portion has a changeable direction of magnetization. The second portion is stacked with the first portion in a stacking direction of the first ferromagnetic layer and the second ferromagnetic layer. The second portion has a changeable direction of magnetization. A magnetic resonance frequency of the second portion is lower than a magnetic resonance frequency of the first portion. The first nonmagnetic layer is provided between the first ferromagnetic layer and the second ferromagnetic layer. The second stacked unit is stacked with the first stacked unit in the stacking direction. The second stacked unit includes a third ferromagnetic layer having a changeable direction of magnetization. A rotating magnetic field is generated by a precession of the magnetization of the third ferromagnetic layer when a current flows in the first stacked unit and the second stacked unit in one of a direction from the first stacked unit toward the second stacked unit and a direction from the second stacked unit toward the first stacked unit. The direction of the magnetization of the first portion and the direction of the magnetization of the second portion is oriented in a direction corresponding to an orientation of the current due to actions of the rotating magnetic field and spin-polarized electrons. The first interconnect is electrically connected to one end of the magnetic memory element. The second interconnect is electrically connected to one other end of the magnetic memory element. The control unit is electrically connected to the magnetic memory element via the first interconnect and the second interconnect. The control unit is configured to set a time to supply the current to the magnetic memory element in a writing operation to change the direction of the magnetization of the first portion and the direction of the magnetization of the second portion to be longer than a time to supply the current to the magnetic memory element in a read-out operation to read the direction of the magnetization of the first portion and the direction of the magnetization of the second portion.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a nonvolatile memory device according to a first embodiment.

As shown in FIG. 1, the nonvolatile memory device 610 according to the embodiment includes a magnetic memory element 110 and a control unit 550.

The magnetic memory element 110 includes a stacked body SB0. The stacked body SB0 includes a first stacked unit SB1 and a second stacked unit SB2.

The control unit 550 is electrically connected to the magnetic memory element 110. The control unit 550 controls the operation of the magnetic memory element 110 by applying a voltage and supplying a current to the magnetic memory element 110.

The first stacked unit SB1 includes a first ferromagnetic layer 10, a second ferromagnetic layer 20, and a first nonmagnetic layer 10n.

The first ferromagnetic layer 10 has a major surface 10a. The direction of a magnetization 10m of the first ferromagnetic layer 10 is substantially fixed. The direction of the magnetization 10m of the first ferromagnetic layer 10 has, for example, a component perpendicular to the major surface 10a. The direction of the magnetization 10m of the first ferromagnetic layer 10 is non-parallel to the major surface 10a.

The second ferromagnetic layer 20 is stacked with the first ferromagnetic layer 10. The second ferromagnetic layer 20 has a first portion 21 and a second portion 22. The direction of a magnetization 21m of the first portion 21 is changeable. The second portion 22 is stacked with the first portion 21 in a stacking direction SD1 of the first ferromagnetic layer 10 and the second ferromagnetic layer 20. The stacking direction SD1 is, for example, perpendicular to the major surface 10a. In the example, the second portion 22 is provided between the first ferromagnetic layer 10 and the first portion 21. The direction of a magnetization 22m of the second portion 22 is changeable. The magnetization 21m of the first portion 21 is ferromagnetically coupled with the magnetization 22m of the second portion 22. The magnetic resonance frequency of the second portion 22 is lower than the magnetic resonance frequency of the first portion 21. The magnetic resonance frequency of the first portion 21 is, for example, not less than 20 GHz. The magnetic resonance frequency of the second portion 22 is, for example, less than 20 GHz.

The first portion 21 and the second portion 22 include, for example, alloys. The concentration of at least one element included in the second portion 22 is different from the concentration of the same element included in the first portion 21. In other words, the composition ratio of the alloy included in the second portion 22 is different from the composition ratio of the alloy included in the first portion 21. The second portion 22 is, for example, a portion of the second ferromagnetic layer 20 for which the composition ratio of the alloy has been changed from that of the first portion 21.

The material of the second portion 22 may be different from the material of the first portion 21. In such a case, each of the first portion 21 and the second portion 22 may be considered to be one layer included in the second ferromagnetic layer 20. In other words, the second ferromagnetic layer 20 may be a stacked body including a first layer and a second layer.

The first nonmagnetic layer 10n is provided between the first ferromagnetic layer 10 and the second ferromagnetic layer 20. The first nonmagnetic layer 10n contacts, for example, the first ferromagnetic layer 10 and the second ferromagnetic layer 20. The first ferromagnetic layer 10, the second ferromagnetic layer 20, and the first nonmagnetic layer 10n are stacked in the stacking direction SD1.

In the specification of the application, the state of being stacked includes not only the state of overlapping in direct contact but also the case of overlapping with another component inserted therebetween.

A direction parallel to the stacking direction SD1 of the first stacked unit SB1 is taken as a Z-axis direction. One axis perpendicular to the Z axis is taken as an X axis. An axis perpendicular to the X axis and the Z axis is taken as a Y axis. The film surfaces of the layers included in the stacked body SB0 are parallel to the X-Y plane. For example, the major surface 10a is parallel to the X-Y plane.

The second stacked unit SB2 is stacked with the first stacked unit SB1 in the stacking direction SD1. The second stacked unit SB2 includes a third ferromagnetic layer 30. The third ferromagnetic layer 30 is stacked with the first stacked unit SB1 in the stacking direction SD1. The direction of the magnetization of the third ferromagnetic layer 30 is changeable. The width (the length in a direction perpendicular to the stacking direction SD1) of the third ferromagnetic layer 30 is, for example, not more than 35 nanometers (nm). For example, in the case where the configuration of the third ferromagnetic layer 30 is a circle when projected onto the X-Y plane, the diameter of the circle is not more than 35 nm. For example, the maximum length in the in-plane direction (the direction perpendicular to the stacking direction SD1) of the third ferromagnetic layer 30 is not more than 35 nm. The thickness (the length in the stacking direction SD1) of the third ferromagnetic layer 30 is, for example, not less than 0.5 nm and not more than 3.5 nm.

In the example, the second stacked unit SB2 further includes a fourth ferromagnetic layer 40 and a second nonmagnetic layer 20n. The fourth ferromagnetic layer 40 is stacked with the third ferromagnetic layer 30 in the stacking direction SD1. The direction of the magnetization of the fourth ferromagnetic layer 40 is substantially fixed. The second nonmagnetic layer 20n is provided between the third ferromagnetic layer 30 and the fourth ferromagnetic layer 40. The second nonmagnetic layer 20n contacts, for example, the third ferromagnetic layer 30 and the fourth ferromagnetic layer 40.

In the example, the stacked body SB0 further includes a third nonmagnetic layer 30n. The third nonmagnetic layer 30n is provided between the first stacked unit SB1 and the second stacked unit SB2. In the example, the first ferromagnetic layer 10, the first nonmagnetic layer 10n, the second ferromagnetic layer 20, the third nonmagnetic layer 30n, the third ferromagnetic layer 30, the second nonmagnetic layer 20n, and the fourth ferromagnetic layer 40 are stacked in this order. The third nonmagnetic layer 30n is, for example, a spin quenching layer that quenches the spin polarization of the electrons that flow. The third nonmagnetic layer 30n contacts, for example, the first stacked unit SB1 and the second stacked unit SB2. In the example, the third nonmagnetic layer 30n contacts the second ferromagnetic layer 20 and the third ferromagnetic layer 30.

In the example, the magnetic memory element 110 further includes a first conductive layer 81 and a second conductive layer 82. The first stacked unit SB1 is disposed between the first conductive layer 81 and the second conductive layer 82. The second stacked unit SB2 is disposed between the first stacked unit SB1 and the second conductive layer 82. The first conductive layer 81 is electrically connected to the first stacked unit SB1. In the example, the first conductive layer 81 is electrically connected to the first ferromagnetic layer 10. The second conductive layer 82 is electrically connected to the second stacked unit SB2. In the example, the second conductive layer 82 is electrically connected to the fourth ferromagnetic layer 40.

The first conductive layer 81 and the second conductive layer 82 are electrically connected to the control unit 550. The magnetic memory element 110 is connected directly or indirectly to the control unit 550 via the first conductive layer 81 and the second conductive layer 82. The first conductive layer 81 and the second conductive layer 82 may be considered to be separate from the magnetic memory element 110. The nonvolatile memory device 610 further includes, for example, a first interconnect 91 and a second interconnect 92 (referring to FIG. 28). The first interconnect 91 is electrically connected to, for example, the first conductive layer 81. The second interconnect 92 is electrically connected to, for example, the second conductive layer 82. The control unit 550 is electrically connected to, for example, the magnetic memory element 110 via the first interconnect 91 and the second interconnect 92.

According to the nonvolatile memory device 610 according to the embodiment, a magnetic memory element and a nonvolatile memory device in which misoperations are suppressed can be provided. In the magnetic memory element 110, the magnetization 21m of the first portion 21 is ferromagnetically coupled with the magnetization 22m of the second portion 22. Thereby, for example, the Δ value, i.e., the thermal agitation resistance, of the second ferromagnetic layer 20 in the magnetostatic state can be increased. Accordingly, misoperations of the magnetic memory element 110 and the nonvolatile memory device 610 can be suppressed. For example, the memory retention time of the magnetic memory element 110 can be increased. Also, the current value when writing operation can be reduced.

The Δ value is, for example, the ratio of the magnetic anisotropy energy and the thermal energy of the second ferromagnetic layer 20. The Δ value can be represented by, for example, the following formula.

$$\Delta = Ku \cdot V / K_B \cdot T$$

In the formula recited above, Ku is the effective magnetic anisotropy constant, V is the volume of the second ferromagnetic layer 20, $K_B$ is the Boltzmann constant, and T is the absolute temperature of the magnetic memory element 110.

An example of the configuration and operations of the magnetic memory element 110 will now be described. The following description is applicable not only to the magnetic memory element 110 but also to other magnetic memory elements according to the embodiment that are described below.

In the magnetic memory element 110, spin-polarized electrons are caused to act on the second ferromagnetic layer 20 by causing a current to flow in the first stacked unit SB1 and the second stacked unit SB2 in the stacking direction SD1 (in one of a direction from the first stacked unit SB1 toward the second stacked unit SB2 and a direction from the second stacked unit SB2 toward the first stacked unit SB1). Also, in the magnetic memory element 110, a rotating magnetic field that is generated by causing a precession of the magnetization of the third ferromagnetic layer 30 is caused to act on the second ferromagnetic layer 20. Thereby, the direction of the magnetization 21m of the first portion 21 of the second ferromagnetic layer 20 and the direction of the magnetization 22m of the second portion 22 of the second ferromagnetic layer are determined by a direction corresponding to the orientation of the current.

The first ferromagnetic layer 10 behaves as, for example, a first fixed magnetic layer. In the first ferromagnetic layer 10, for example, the magnetization 10m is fixed in a direction that is substantially perpendicular to the film surface. The direction of the magnetization 10m of the first ferromagnetic layer 10 is substantially parallel to the stacking direction SD1.

In the first portion 21 of the second ferromagnetic layer 20, for example, the direction of the magnetization 21m of the first portion 21 is a direction that is substantially perpendicular to the film surface and is substantially parallel to the stacking direction SD1. The magnetization 21m of the first portion 21 is reversible. The first portion 21 performs the role of storing data. The first portion 21 behaves as, for example, a magnetic memory layer.

In the second portion 22 of the second ferromagnetic layer 20, for example, the direction of the magnetization 22m of the second portion 22 is a direction that is substantially perpendicular to the film surface and is substantially parallel to the stacking direction SD1. The magnetization 22m of the second portion 22 is reversible. The magnetization 22m of the second portion 22 undergoes magnetization reversal faster than the magnetization 21m of the first portion 21 and assists the magnetization reversal of the magnetization 21m of the first portion 21 when, for example, the current flows in the stacked body SB0 in the stacking direction SD1. The second portion 22 behaves as, for example, a trigger of the magnetization reversal of the first portion 21. The second portion 22 is, for example, a trigger layer.

The second portion 22 also contributes to the memory retention of the data. Accordingly, the second ferromagnetic layer 20 may be considered to be a magnetic memory layer; the first portion 21 may be considered to be the main body portion of the memory retention; and the second portion 22 may be considered to be the trigger portion of the magnetization reversal.

The first nonmagnetic layer 10n behaves as a first spacer layer. In the case where the first nonmagnetic layer 10n is a tunneling barrier layer based on an insulating material, the first stacked unit SB1 that includes the first ferromagnetic layer 10, the first nonmagnetic layer 10n, the second ferromagnetic layer has, for example, a MTJ (Magnetic Tunnel Junction) structure.

In the third ferromagnetic layer 30, for example, the magnetization component projected onto the stacking direction SD1 is smaller than the magnetization component projected onto a direction perpendicular to the stacking direction SD1. The easy magnetization axis of the third ferromagnetic layer 30 is substantially parallel to the film surface. The third ferromagnetic layer 30 performs the role of generating a high frequency magnetic field when writing operation. The third ferromagnetic layer 30 behaves as, for example, a magnetization rotation layer (a generation layer).

The fourth ferromagnetic layer 40 behaves as, for example, a second fixed magnetic layer. The direction of a magnetization 40m of the fourth ferromagnetic layer 40 is fixed in, for example, a direction that is substantially perpendicular to the film surface. For example, the direction of the magnetization 40m of the fourth ferromagnetic layer 40 is a direction that is substantially perpendicular to the film surface. The second nonmagnetic layer 20n behaves as a second spacer layer.

The first ferromagnetic layer 10, the second ferromagnetic layer 20, and the fourth ferromagnetic layer 40 include, for example, perpendicular magnetization films. The third ferromagnetic layer 30 includes, for example, an in-plane magnetization film.

Figures 2A, 2B:
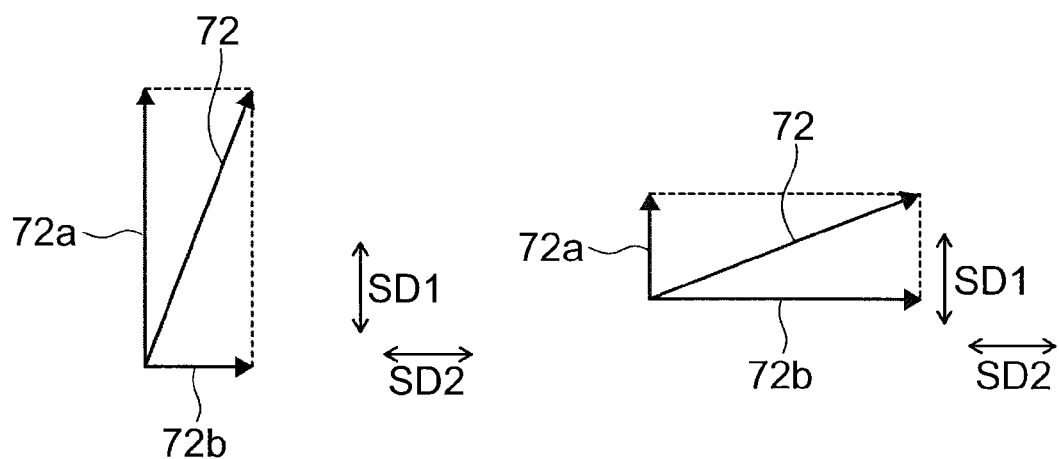
FIGS. 2A and 2B are schematic views showing magnetizations.

FIGS. 2A and 2B are schematic views showing magnetizations.

FIG. 2A shows the magnetization of a perpendicular magnetization film. FIG. 2B shows the magnetization of an in-plane magnetization film.

As shown in FIGS. 2A and 2B, one direction perpendicular to the stacking direction SD1 is taken as an in-plane direction SD2. The in-plane direction SD2 is a direction in the X-Y plane. An in-plane magnetization component 72b of a magnetization 72 is the component of the magnetization 72 projected onto the X-Y plane. The in-plane magnetization component 72b is parallel to the in-plane direction SD2. A perpendicular magnetization component 72a of the magnetization 72 is the component of the magnetization 72 projected onto the Z-axis direction. The perpendicular magnetization component 72a is parallel to the stacking direction SD1.

As shown in FIG. 2A, the perpendicular magnetization film has a magnetization state in which the perpendicular magnetization component 72a is larger than the in-plane magnetization component 72b. It is desirable for the operating characteristics that the direction of the magnetization of the perpendicular magnetization film is substantially perpendicular to the film surface.

As shown in FIG. 2B, the in-plane magnetization film has a magnetization state in which the in-plane magnetization component 72b is larger than the perpendicular magnetization component 72a. It is desirable for the operating characteristics that the direction of the magnetization of the in-plane magnetization film is substantially parallel to the film surface.

For convenience of description, the direction from the first stacked unit SB1 toward the second stacked unit SB2 is called "up" or "upward." The direction from the second stacked unit SB2 toward the first stacked unit SB1 is called "down" or "downward."

As described above, the direction of the magnetization 10m of the first ferromagnetic layer 10 is substantially fixed. The direction of the magnetization 40m of the fourth ferromagnetic layer 40 is substantially fixed.

In the magnetic memory element 110 as shown in FIG. 1, the direction of the magnetization 10m of the first ferromagnetic layer 10 is upward; and the direction of the magnetization 40m of the fourth ferromagnetic layer 40 is downward. The orientation of the stacking direction SD1 component of the magnetization 10m of the first ferromagnetic layer 10 is, for example, the reverse of the orientation of the stacking direction SD1 component of the magnetization 40m of the fourth ferromagnetic layer 40. However, various modifications to the direction of the magnetization 10m of the first ferromagnetic layer 10 and the direction of the magnetization 40m of the fourth ferromagnetic layer 40 are possible. For example, both the direction of the magnetization 10m of the first ferromagnetic layer 10 and the direction of the magnetization 40m of the fourth ferromagnetic layer 40 may be upward or downward; or one may be upward and the other may be downward.

The magnetic memory element 110 can cause, for example, an electron current to flow in the first stacked unit SB1 and the second stacked unit SB2 via the first conductive layer 81 and the second conductive layer 82. The electron current is a flow of electrons. When a current flows upward, an electron current flows downward.

A magnetization 30m of the third ferromagnetic layer 30 which is the magnetic field source precesses when the electron current is caused to flow in a direction perpendicular to the film surface. Thereby, a rotating magnetic field (a high frequency magnetic field) is generated. The frequency of the high frequency magnetic field is, for example, about 1 GHz to 60 GHz. The high frequency magnetic field has a component in the direction perpendicular to the magnetization 21m of the first portion 21 and the magnetization 22m of the second portion 22 of the second ferromagnetic layer 20 (a component in the direction of the hard magnetization axes of the first portion 21 and the second portion 22). Accordingly, at least a portion of the high frequency magnetic field generated by the third ferromagnetic layer 30 is applied in the direction of the hard magnetization axes of the first portion 21 and the second portion 22. The magnetization 21m of the first portion 21 and the magnetization 22m of the second portion 22 reverse more easily when the high frequency magnetic field generated by the third ferromagnetic layer 30 is applied in the direction of the hard magnetization axes of the first portion 21 and the second portion 22.

In the magnetic memory element 110, the direction of the magnetization 21m of the first portion 21 and the direction of the magnetization 22m of the second portion 22 can be controlled by causing the electron current to flow in the first stacked unit SB1 and the second stacked unit SB2. Specifically, the orientation of the magnetization 21m of the first portion 21 and the orientation of the magnetization 22m of the second portion 22 can be reversed by changing the orientation (the polarity) in which the electron current flows. In the case where information is stored, for example, "0" or "1" is allotted according to the direction of the magnetization 21m of the first portion 21. The magnetic memory element 110 has a first state or a second state that is different from the first state. The first state and the second state respectively correspond to the two different directions of the magnetization 21m of the first portion 21.

As described above, it is favorable for the width (the diameter) of the third ferromagnetic layer 30 to be 35 nm or less. In the case where the width of the third ferromagnetic layer 30 is greater than 35 nm, for example, a vortex (a closure domain) occurs when the magnetization 30m of the third ferromagnetic layer 30 precesses. For example, the generation of the vortex can be suppressed by setting the equivalent circular diameter of the cross-sectional configuration of the third ferromagnetic layer 30 to be not more than 35 nm and the thickness of the third ferromagnetic layer 30 to be not less than 0.5 nm and not more than 3.5 nm. Thereby, for example, the magnetization reversal of the first portion 21 and the second portion 22 of the second ferromagnetic layer 20 can be assisted by causing the high frequency magnetic field generated by the third ferromagnetic layer 30 to act more appropriately on the magnetization reversal of the second ferromagnetic layer 20. In other words, a magnetic field intensity that is sufficient to reverse the magnetization 21m of the first portion 21 and the magnetization 22m of the second portion 22 can be obtained at the position of the second ferromagnetic layer 20.

It is desirable for the horizontal cross-sectional configuration (the cross-sectional configuration when cut by a plane perpendicular to the stacking direction SD1) of the third ferromagnetic layer 30 to satisfy the relational expression $r<0.419t^2-2.86t+19.8$, where the equivalent circular diameter of the horizontal cross-sectional configuration is R (nm), the value of half of R is r (=R/2) (nm), and the layer thickness is t (nm).

In the specification of the application, the "equivalent circular diameter" is the diameter of an imaginary circle having the same surface area as the surface area of the planar configuration of interest. For example, in the case where the horizontal cross-sectional configuration of the third ferromagnetic layer 30 is a circle, R is the diameter. In the case where the horizontal cross-sectional configuration of the third ferromagnetic layer 30 is an ellipse, R is the diameter of a circle having the same surface area as the surface area of the ellipse. In the case where the horizontal cross-sectional configuration of the third ferromagnetic layer 30 is a polygon, R is the diameter of a circle having the same surface area as the surface area of the polygon.

First, an example of the writing operation will be described as a specific example of the operations of the magnetic memory element 110.

FIGS. 3A to 3E and FIGS. 4A to 4E are schematic views showing operations of the nonvolatile memory device according to the first embodiment.

These drawings show states of the first stacked unit SB1 and the second stacked unit SB2 in the writing operation of the magnetic memory element 110. In the writing operation, the writing operation of the second ferromagnetic layer 20 is implemented by causing an electron current 60 to flow across the film surface of the first ferromagnetic layer 10 and the film surface of the second ferromagnetic layer 20. Here, the case is described where the magnetoresistance effect via the first nonmagnetic layer 10n is the normal type.

In the normal-type magnetoresistance effect, the electrical resistance when the magnetizations of the magnetic layers on two sides of the nonmagnetic layer are parallel to each other is lower than the electrical resistance when the magnetizations are antiparallel. In the case of the normal type, the electrical resistance between the first ferromagnetic layer and the second ferromagnetic layer 20 via the first nonmagnetic layer 10n is lower when the magnetization 10m of the first ferromagnetic layer 10 is parallel to the magnetizations 21m and 22m of the second ferromagnetic layer 20 than when the magnetization 10m of the first ferromagnetic layer 10 is antiparallel to the magnetizations 21m and 22m of the second ferromagnetic layer 20.

FIGS. 3A to 3E show the case where the magnetization 21m of the first portion 21 and the orientation of the magnetization 22m of the second portion 22 of the second ferromagnetic layer 20 are reversed from upward to downward.

FIG. 3A shows the state in which the electron current 60 is caused to start to flow. FIG. 3E shows the state in which the flow of the electron current 60 has been stopped (the state in which the magnetization 21m and the magnetization 22m have reversed). FIGS. 3B to 3D show the intermediate states.

As shown in FIG. 3A, in the case where the orientation of the magnetization 21m and the orientation of the magnetization 22m are to be reversed from upward to downward, the electron current 60 is caused to flow from the second stacked unit SB2 toward the first stacked unit SB1. In other words, the electron current 60 is caused to flow downward.

When the electron current 60 is caused to flow downward, the electrons passing through the first nonmagnetic layer 10n that have spins with the same orientation as the magnetization 10m of the first ferromagnetic layer 10 (in the example, upward) pass through the first ferromagnetic layer 10. On the other hand, the electrons that have spins with a reverse orientation with respect to the magnetization 10m of the first ferromagnetic layer 10 (in the example, downward) are reflected at the interface between the first ferromagnetic layer and the first nonmagnetic layer 10n. The angular momentum of the spins of the reflected electrons is transferred to the second ferromagnetic layer 20 and acts on the magnetization 21m and the magnetization 22m of the second ferromagnetic layer 20.

As shown in FIG. 3B, the magnetization 30m of the third ferromagnetic layer 30 precesses to generate a rotating magnetic field when the electron current 60 is caused to flow. The electrons that pass through the fourth ferromagnetic layer 40 having the magnetization 40m in the direction substantially perpendicular to the film surface have spins in the same direction as the magnetization 40m of the fourth ferromagnetic layer 40. When the electrons flow into the third ferromagnetic layer 30, the angular momentum of the spins is transferred to the third ferromagnetic layer 30 and acts on the magnetization 30m of the third ferromagnetic layer 30. In other words, a so-called spin-transfer torque acts. Thereby, the magnetization 30m precesses by supplying the electron current 60. The spin polarization of the electrons passing through the third ferromagnetic layer 30 is quenched by passing through the third nonmagnetic layer 30n.

When the magnetization 30m of the third ferromagnetic layer 30 precesses as shown in FIG. 3C, first, the orientation of the magnetization 22m of the second portion 22 which is the trigger layer reverses from upward to downward due to the action of the rotating magnetic field from the third ferromagnetic layer 30 and the action of the spin-polarized electrons reflected at the interface between the first ferromagnetic layer 10.

As described above, the magnetic resonance frequency of the second portion 22 is lower than the magnetic resonance frequency of the first portion 21. The frequency of the rotating magnetic field generated by the third ferromagnetic layer 30 is set to match the magnetic resonance frequency of the second portion 22. Thereby, the orientation of the magnetization 22m of the second portion 22 reverses from upward to downward due to the action of the electrons that have downward spins and the action of the rotating magnetic field.

When the orientation of the magnetization 22m of the second portion 22 reverses from upward to downward as shown in FIG. 3D, the orientation of the magnetization 21m of the first portion 21 reverses from upward to downward due to the action of the spin-polarized electrons, the action of the rotating magnetic field from the third ferromagnetic layer 30, and the action of the ferromagnetically-coupled magnetization 22m.

When the supply of the electron current 60 is stopped as shown in FIG. 3E, the precession of the magnetization 30m stops; and the state in which the orientation of the magnetization 21m and the orientation of the magnetization 22m are reversed from upward to downward is maintained. For example, "0" is allotted to the state of the second ferromagnetic layer 20 having the magnetization 21m and the magnetization 22m of these orientations. In the magnetic memory element 110, for example, the state in which the orientation of the magnetization 21m and the orientation of the magnetization 22m of the second ferromagnetic layer 20 are downward corresponds to the first state.

As shown in FIGS. 3A to 3E, the magnetic memory element 110 has three states between the first state and the second state. As shown in FIG. 3B, one state is the state in which the magnetization 21m and the magnetization 22m are upward and the magnetization 30m precesses. As shown in FIG. 3C, one other state is the state in which one selected from the magnetization 21m and the magnetization 22m is upward, the other is downward, and the magnetization 30m precesses. As shown in FIG. 3D, another state is the state in which the magnetization 21m and the magnetization 22m are downward and the magnetization 30m precesses. In other words, the magnetic memory element 110 has a maximum of five states, that is, the three states recited above plus the first state and the second state.

FIGS. 4A to 4E show the case where the orientations of the magnetization 21m of the first portion 21 and the magnetization 22m of the second portion 22 are to be reversed from downward to upward.

Figure 4A:
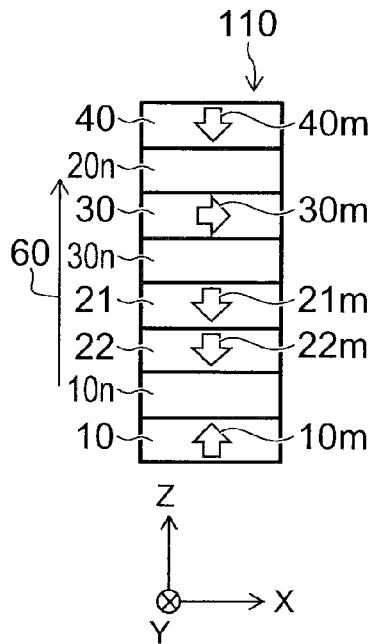
FIGS. 4A to 4E are schematic views showing operations of the nonvolatile memory device according to the first embodiment.
Figure 4B:
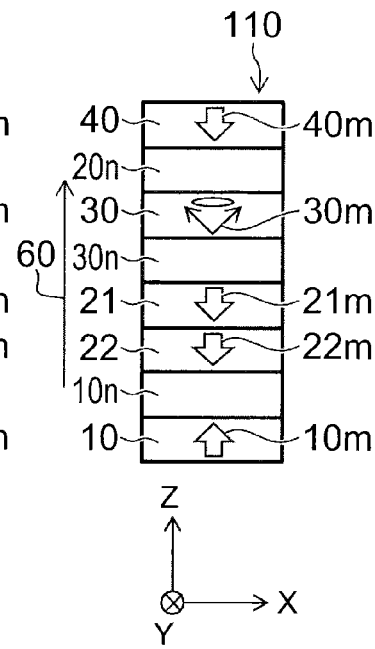
Figure 4C:
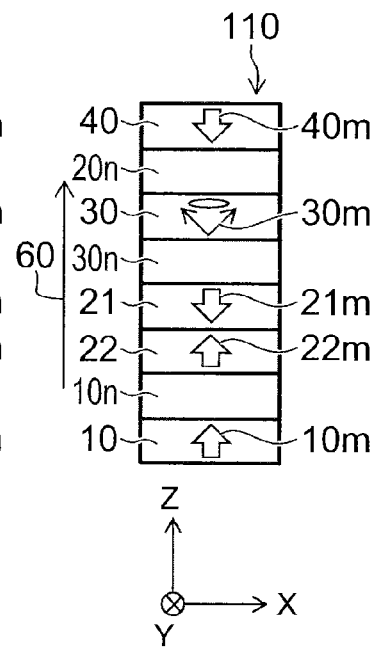
Figure 4D:
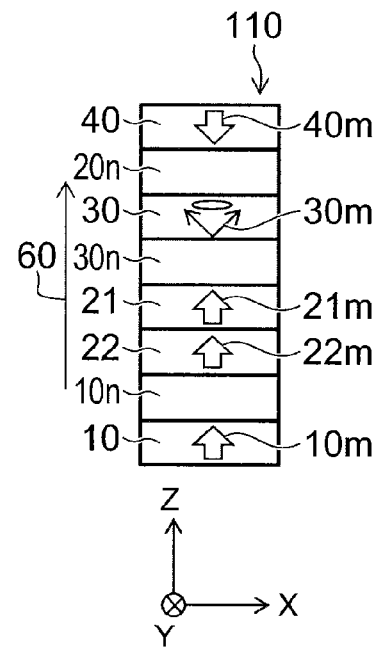
Figure 4E:
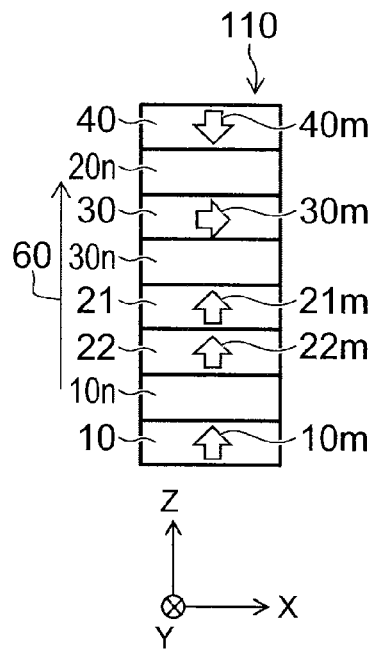

FIG. 4A shows the state in which the electron current 60 is caused to start to flow. FIG. 4E shows the state in which the flow of the electron current 60 has been stopped (the state in which the magnetization 21m and the magnetization 22m have reversed). FIGS. 4B to 4D show the intermediate states.

As shown in FIG. 4A, in the case where the orientation of the magnetization 21m and the orientation of the magnetization 22m are to be reversed from downward to upward, the electron current 60 is caused to flow from the first stacked unit SB1 toward the second stacked unit SB2. In other words, the electron current 60 is caused to flow upward.

As shown in FIG. 4B, the magnetization 30m of the third ferromagnetic layer 30 precesses to generate a rotating magnetic field when the electron current 60 is caused to flow. The electrons that have spins of the reverse orientation with respect to the magnetization 40m of the fourth ferromagnetic layer 40 are reflected at the interface between the fourth ferromagnetic layer 40 and the second nonmagnetic layer 20n. The angular momentum of the spins of the reflected electrons is transferred to the third ferromagnetic layer 30 and acts on the magnetization 30m of the third ferromagnetic layer 30. Thereby, the magnetization 30m precesses.

When the magnetization 30m of the third ferromagnetic layer 30 precesses as shown in FIG. 4C, the orientation of the magnetization 22m of the second portion 22 reverses from downward to upward due to the action of the spin-polarized electrons and the action of the rotating magnetic field from the third ferromagnetic layer 30.

When the electron current 60 is caused, the electrons that have spins with the same orientation as the magnetization 10m of the first ferromagnetic layer 10 (in the example, upward) pass through the first ferromagnetic layer 10 and are transferred to the second ferromagnetic layer 20 to flow upward. Thereby, the orientation of the magnetization 22m of the second portion 22 reverses from downward to upward due to the action of the electrons that have upward spins and the action of the rotating magnetic field from the third ferromagnetic layer 30.

When the orientation of the magnetization 22m of the second portion 22 reverses from downward to upward as shown in FIG. 4D, the orientation of the magnetization 21m of the first portion 21 reverses from downward to upward due to the action of the spin-polarized electrons, the action of the rotating magnetic field from the third ferromagnetic layer 30, and the action of the ferromagnetically-coupled magnetization 22m.

When the supply of the electron current 60 is stopped as shown in FIG. 4E, the precession of the magnetization 30m stops; and the state in which the orientation of the magnetization 21m and the orientation of the magnetization 22m are reversed from downward to upward is maintained. For example, "1" is allotted to the state of the second ferromagnetic layer 20 having the magnetization 21m and the magnetization 22m of these orientations. In the magnetic memory element 110, for example, the state in which the orientations of the magnetization 21m and the magnetization 22m of the second ferromagnetic layer 20 are upward corresponds to the second state.

Based on such actions, "0" and "1" are appropriately allotted respectively to the different states of the second ferromagnetic layer 20. Thereby, the writing of the magnetic memory element 110 is implemented.

In the case where the magnetoresistance effect is the reverse type, the electrical resistance between the first ferromagnetic layer 10 and the second ferromagnetic layer 20 via the first nonmagnetic layer 10n is higher when the magnetization 10m of the first ferromagnetic layer 10 is parallel to the magnetizations 21m and 22m of the second ferromagnetic layer 20 than when the magnetization 10m of the first ferromagnetic layer 10 is antiparallel to the magnetizations 21m and 22m of the second ferromagnetic layer 20. The writing operation of the reverse type is similar to the case of the normal type.

In the example, for example, the first state is "0;" and the second state is "1." The first state may be "1;" and the second state may be "0." The first state and the second state are not limited to "0" or "1" and may be other states. The number of states provided in the magnetic memory element 110 may be three or more. In other words, the magnetic memory element 110 may be a multi-bit memory element.

The setting of the first state or the second state is implemented by the control unit 550. For example, the setting of the first state corresponds to writing; and the setting of the second state corresponds to erasing. The setting of the second state may correspond to writing; and the setting of the first state may correspond to erasing.

The supply of the electron current 60 is performed by, for example, the control unit 550. In the writing operation, for example, the control unit 550 supplies the electron current 60 for not less than 10 nanoseconds to the magnetic memory element 110. Thereby, for example, the orientation of the magnetization 21$m$ and the orientation of the magnetization 22$m$ can be reversed appropriately by supplying the electron current 60. More favorably, the supply is for not less than 3 nanoseconds. Thereby, for example, the time necessary for the writing operation can be suppressed while appropriately reversing the magnetizations.

An example of a read-out operation will now be described.

The sensing of the directions of the magnetization 21$m$ and the magnetization 22$m$ of the second ferromagnetic layer 20 of the magnetic memory element 110 is implemented by, for example, utilizing the magnetoresistance effect. In the magnetoresistance effect, the electrical resistance changes due to relative orientations of the magnetizations of each layer. In the case where the magnetoresistance effect is utilized, a sense current is caused to flow between the first ferromagnetic layer and the second ferromagnetic layer 20; and the magnetoresistance is measured. The current value of the sense current is less than the value of a current corresponding to the electron current 60 caused to flow when writing (when storing).

Figure 5A:
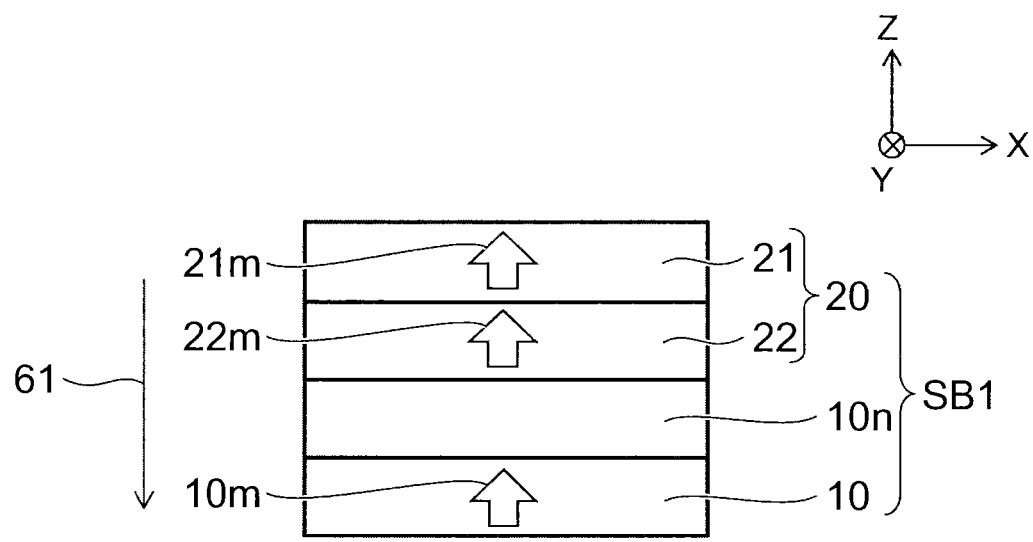
FIGS. 5A and 5B are schematic views showing an operation of the nonvolatile memory device according to the first embodiment.
Figure 5B:
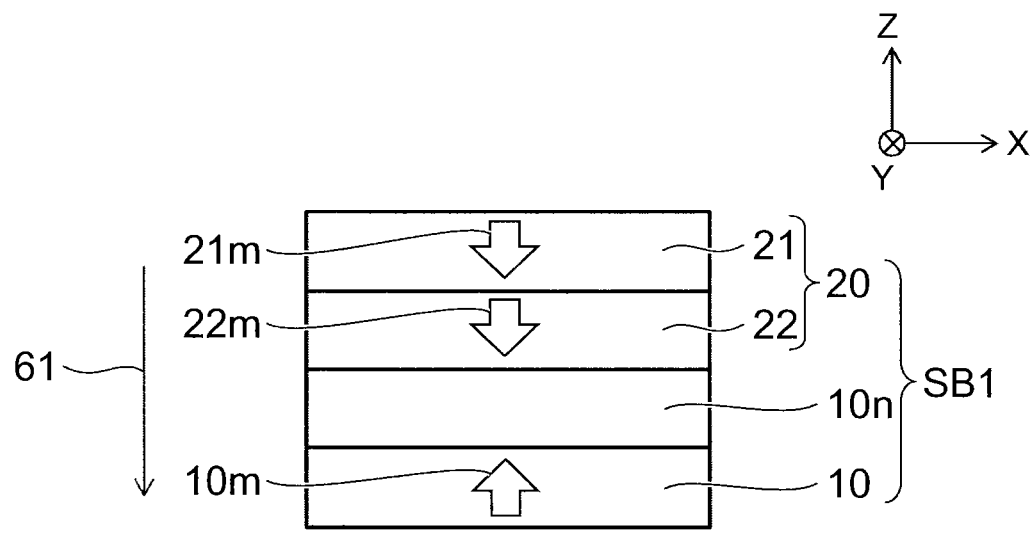

FIGS. 5A and 5B are schematic views showing an operation of the nonvolatile memory device according to the first embodiment.

These drawings show the state of the first stacked unit SB1 of the magnetic memory element 110 in the read-out operation. The second stacked unit SB2, the first conductive layer 81, the second conductive layer 82, and the third nonmagnetic layer 30$n$ are not shown in these drawings.

FIG. 5A shows the case where the direction of the magnetization 10$m$ of the first ferromagnetic layer 10 is the same as the directions of the magnetization 21$m$ and the magnetization 22$m$ of the second ferromagnetic layer 20. FIG. 5B shows the case where the direction of the magnetization 10$m$ of the first ferromagnetic layer 10 is antiparallel (reversely oriented) to the directions of the magnetization 21$m$ and the magnetization 22$m$ of the second ferromagnetic layer 20.

As shown in FIGS. 5A and 5B, a sense current 61 is caused to flow in the first stacked unit SB1; and the electrical resistance is sensed.

In the case of the normal magnetoresistance effect, the resistance in the state of FIG. 5A is lower than the resistance in the state of FIG. 5B. In the case of the reverse magnetoresistance effect, the resistance in the state of FIG. 5A is higher than the resistance in the state of FIG. 5B.

It is possible to read a record of binary data by associating the multiple states having mutually different resistances with "0" and "1," respectively. The orientation of the sense current 61 may be reversely oriented with respect to the direction shown in FIGS. 5A and 5B.

The supply of the sense current 61 is performed by, for example, the control unit 550. In the read-out operation, for example, the control unit 550 supplies the sense current 61 for not more than 3 nanoseconds to the magnetic memory element 110. Thereby, for example, the reverse of the orientation of the magnetization 21$m$ and the reverse of the orientation of the magnetization 22$m$ by the supply of the sense current 61 can be suppressed. More favorably, the supply is not more than 1 nanosecond. Thereby, the reverse of the magnetization by the supply of the sense current 61 can be suppressed more appropriately.

Thus, the control unit 550 sets the time to supply the current to the magnetic memory element 110 when writing to be longer than the time to supply the current to the magnetic memory element 110 when reading. For example, the control unit 550 supplies the current to the magnetic memory element 110 for a first time when writing and supplies the current to the magnetic memory element 110 for a second time when reading. In such a case, the first time is longer than the second time. Thereby, for example, a stable writing operation and a stable read-out operation can be obtained.

A writing current for 10 nanoseconds to 30 nanoseconds is assumed as the memory operation corresponding to DRAM. On the other hand, a writing current for 1 nanosecond to 3 nanoseconds is assumed for applications corresponding to cache memory.

The write time (the first time) is, for example, not less than 10 nanoseconds; and the read-out time (the second time) is less than the write time. Because the magnetization is no longer affected by heat (due to the assist effect) in a magnetization reversal of 3 nanoseconds or less, the current that is necessary for the reverse starts to increase. The vicinity of 1 nanosecond is called the dynamic region; and the current that is necessary for the reverse increases further because the magnetization is not affected by the heat.

Therefore, the writing is set to be 10 nanoseconds or more; and the reading is set to be 3 nanoseconds or less. The miswrite rate can be reduced further by setting the writing to be not less than 1 nanosecond and not more than 3 nanoseconds and by setting the reading to use a current value that is smaller than that of the writing and not more than 3 nanoseconds.

As recited above, the second stacked unit SB2 behaves as a magnetic field source in the magnetic memory element 110. The first stacked unit SB1 behaves as a magnetic memory unit. Hereinbelow, there are cases where the second stacked unit SB2 is referred to as a magnetic field source or a STO (Spin Torque Oscillator). On the other hand, there are cases where the first stacked unit SB1 is referred to as a magnetic memory unit or a MTJ.

As recited above, the writing to the second ferromagnetic layer 20 which is the memory layer and trigger layer of the MTJ element is performed by spin torque writing. In such a magnetic memory element 110, it is desirable for the width of the magnetic memory element 110 to be, for example, 35 nm or less due to the need for higher bit density. The width of the magnetic memory element 110 is, for example, the length of the magnetic memory element 110 along the X-axis direction or the Y-axis direction. In the case where the configuration of the magnetic memory element 110 projected onto the X-Y plane is a circle or an ellipse, the width of the magnetic memory element 110 is the diameter (the major diameter) of the magnetic memory element 110.

The inventor of the application discovered that the thermal agitation resistance can be maintained in the case where the width of the magnetic memory element 110 is set to be 35 nm or less by providing the first portion 21 and the second portion 22 in the second ferromagnetic layer 20 and by causing the magnetization 21$m$ of the first portion 21 and the magnetization 22$m$ of the second portion 22 to be ferromagnetically coupled. Thereby, misoperations of the magnetic memory element 110 and the nonvolatile memory device 610 according to the embodiment can be suppressed.

Also, the inventor of the application discovered that the magnetization 21m and the magnetization 22m can be reversed at a frequency that is lower than the magnetic resonance frequency of the first portion 21 by setting the magnetic resonance frequency of the second portion 22 to be lower than the magnetic resonance frequency of the first portion 21.

In the case where the width of the magnetic memory element is set to be 35 nm or less, it is favorable for the Δ value of the memory layer to be set to be 60 or more. Thereby, good thermal agitation resistance is obtained. As described above, the Δ value is affected by the element size. Therefore, in the case where the element size is small, it is necessary for the memory layer to include a material having a large effective magnetic anisotropy constant Ku.

An effective anisotropic magnetic field Hk of the memory layer is proportional to the effective magnetic anisotropy constant Ku. Hk is represented by, for example, the formula Hk=2·Ku/Ms. Ms is the saturation magnetization. Therefore, the effective anisotropic magnetic field Hk of the memory layer increases in the case where the memory layer includes a material having a large effective magnetic anisotropy constant Ku.

In the case where the effective anisotropic magnetic field Hk of the memory layer is high, a higher frequency is necessary for the assisting magnetic field when assisting the magnetization reversal of the memory layer by applying the assisting magnetic field from the magnetic field source. For example, in the case where the Δ value is set to be 60 or more, Hk is about 10 kOe to 20 kOe; and a high-frequency assisting magnetic field of about 30 GHz to 60 GHz becomes necessary.

There are many cases where an in-plane magnetization film is used as the magnetic field source to assist the magnetization reversal of the memory layer in two directions from parallel to antiparallel and from antiparallel to parallel. In such a case, for example, it becomes difficult to match the frequency of the magnetic field generated by the magnetic field source and the frequency of the reversal of the magnetization of the memory layer when a magnetic field of about 30 GHz to 60 GHz is generated. For example, the selection of the materials included in the magnetic field source and the memory layer becomes difficult. The degrees of freedom of the design of the magnetic memory element decrease.

Conversely, in the magnetic memory element 110 according to the embodiment, the magnetization 21m of the first portion 21 and the magnetization 22m of the second portion 22 can be reversed by applying a magnetic field having a frequency corresponding to the magnetic resonance frequency of the second portion 22. The magnetic resonance frequency of the second portion 22 is, for example, less than 20 GHz and more favorably 15 GHz or less. Accordingly, the frequency of the rotating magnetic field generated by the third ferromagnetic layer 30 can be set to be, for example, less than 20 GHz. Thereby, for example, it is easier to match the frequency of the rotating magnetic field generated by the third ferromagnetic layer 30 to the magnetic resonance frequencies of the magnetization 21m and the magnetization 22m. For example, in the magnetic memory element 110, the degrees of freedom of the design of the first stacked unit SB1 and the second stacked unit SB2 can be increased.

Figures 6A, 6B, 6C:
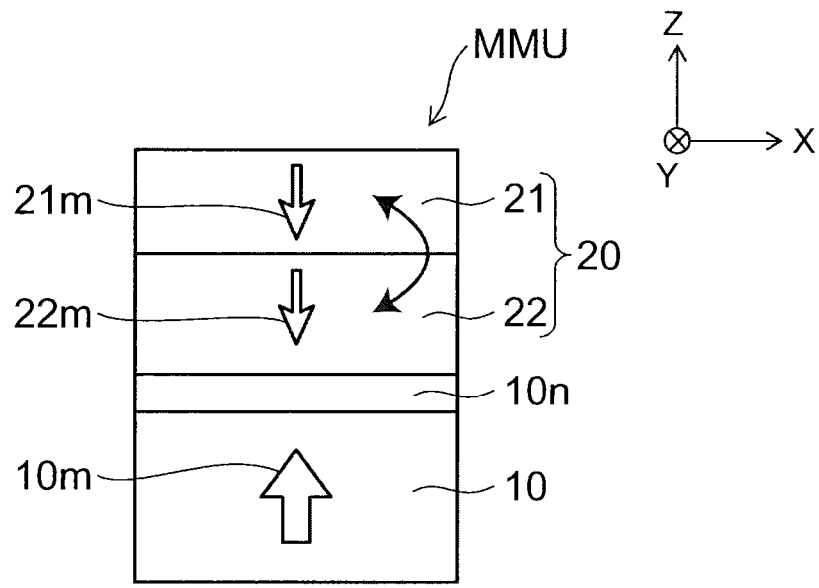
FIGS. 6A to 6C are schematic views showing conditions of a simulation of the magnetic memory unit according to the first embodiment.

FIGS. 6A to 6C are schematic views showing conditions of a simulation of the magnetic memory unit according to the first embodiment.

FIG. 6A is a schematic cross-sectional view showing the magnetic memory unit used in the simulation. FIG. 6B is a table showing the simulation conditions relating to the first portion 21. FIG. 6C is a table showing the simulation conditions relating to the second portion 22.

By micromagnetics-LLG, the simulation confirms that, by providing the trigger layer, the magnetization reversal is assisted by a magnetic field having a frequency that is lower than the magnetic resonance frequency of the memory layer.

In a magnetic memory unit MMU used in the simulation as shown in FIG. 6A, the first ferromagnetic layer 10, the first nonmagnetic layer 10n, and the second ferromagnetic layer 20 are stacked in this order. In the second ferromagnetic layer 20, the second portion 22 is provided between the first ferromagnetic layer 10 and the first portion 21. In other words, the stacking order of the magnetic memory unit MMU is the same as the stacking order of the first stacked unit SB1 of the magnetic memory element 110. The configuration of the magnetic memory unit MMU projected onto the X-Y plane is a circle. The diameter of the magnetic memory unit MMU is 16 nm.

For the first portion 21 (the memory layer) of the magnetic memory unit MMU as shown in FIG. 6B, a thickness t1 is 1 nm; a saturation magnetization Ms1 is 800 emu/cc; an effective magnetic anisotropy constant Ku1 is $12\times10^6$ erg/cm$^3$; and an effective anisotropic magnetic field Hk1 is 22 kOe. In such a case, a magnetic resonance frequency f1 is 62 GHz; and a threshold current Ic1 is 11 μA.

For the second portion 22 (the trigger layer) of the magnetic memory unit MMU as shown in FIG. 6C, a thickness t2 is 2 nm; a saturation magnetization Ms2 is 500 emu/cc; an effective magnetic anisotropy constant Ku2 is $2.4\times10^6$ erg/cm$^3$; and an effective anisotropic magnetic field Hk2 is 4.6 kOe. In such a case, a magnetic resonance frequency f2 is 13 GHz; and a threshold current Ic2 is 3 μA. The frequency band that can be generated by a STO is used when assuming that the second portion 22 is a STO made of an in-plane magnetization generation layer/perpendicularly-magnetized pinned layer having a diameter of 16 nm.

In the simulation, a rotating magnetic field having frequency as a parameter was applied to the magnetic memory unit MMU. The magnetic field intensity of the rotating magnetic field was about 10% of the effective anisotropic magnetic field Hk1 of the first portion 21. A current that was twice the threshold current Ic1 of the first portion 21 was caused to flow upward from below.

Figures 7A, 7B:
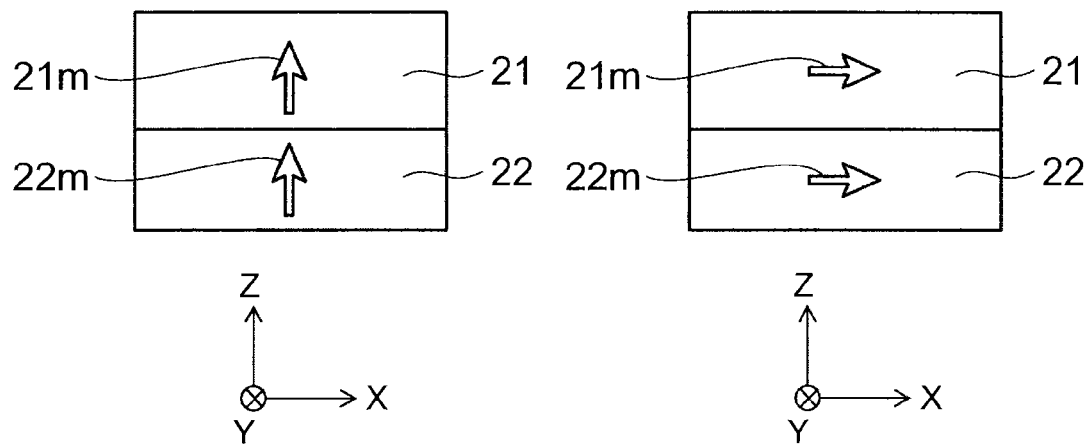
FIGS. 7A to 7C are schematic views showing the simulation results of the magnetic memory unit according to the first embodiment.
Figure 7C:
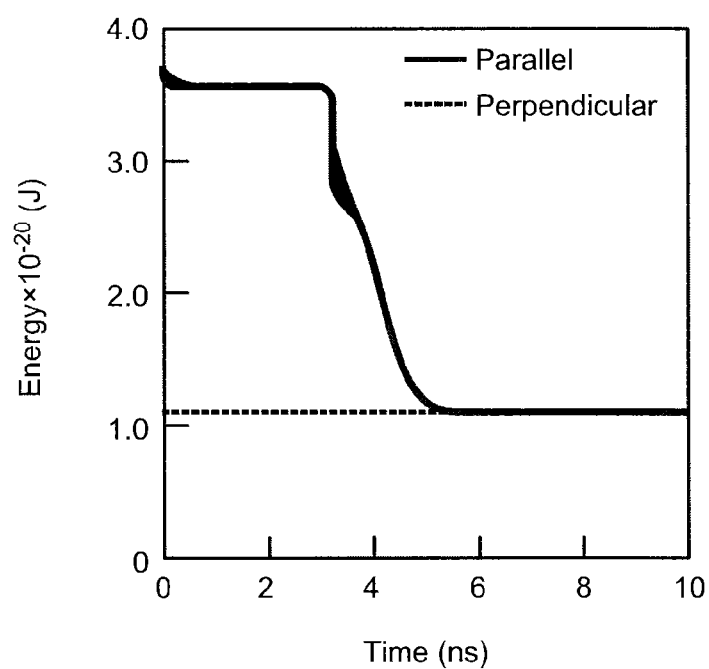

FIGS. 7A to 7C are schematic views showing the simulation results of the magnetic memory unit according to the first embodiment.

FIG. 7A shows the case where the first portion 21 and the second portion 22 of the magnetic memory unit MMU are magnetized in the perpendicular direction. FIG. 7B shows the case where the first portion 21 and the second portion 22 of the magnetic memory unit MMU are magnetized in the in-plane direction. FIG. 7C is a graph showing the simulation results. In FIG. 7C, the horizontal axis is the time (nanoseconds); and the vertical axis is the energy (J).

The simulation examines whether or not the thermal agitation resistance (the Δ value) of the second ferromagnetic layer 20 decreases when the trigger layer is provided.

As shown in FIGS. 7A and 7B, the magnetization relaxation process was calculated for an interval of 10 ns for the case where the initial magnetizations of the memory layer and the trigger layer were tilted in the in-plane direction and the case where the initial magnetizations of the memory layer and the trigger layer were tilted in the perpendicular direction. In this system, the perpendicular magnetization is stable. On the other hand, the in-plane magnetization exceeds the energy barrier and relaxes to the perpendicular magnetization after a constant amount of time.

As shown in FIG. 7C, the perpendicular magnetization is a constant value. On the other hand, the in-plane magnetization maintains a high energy state up to about 3 ns and subsequently relaxes to the perpendicular magnetization and transitions to a low energy state. The Δ value of the second ferromagnetic layer 20 was determined from the energy barrier at this time.

Figure 8:
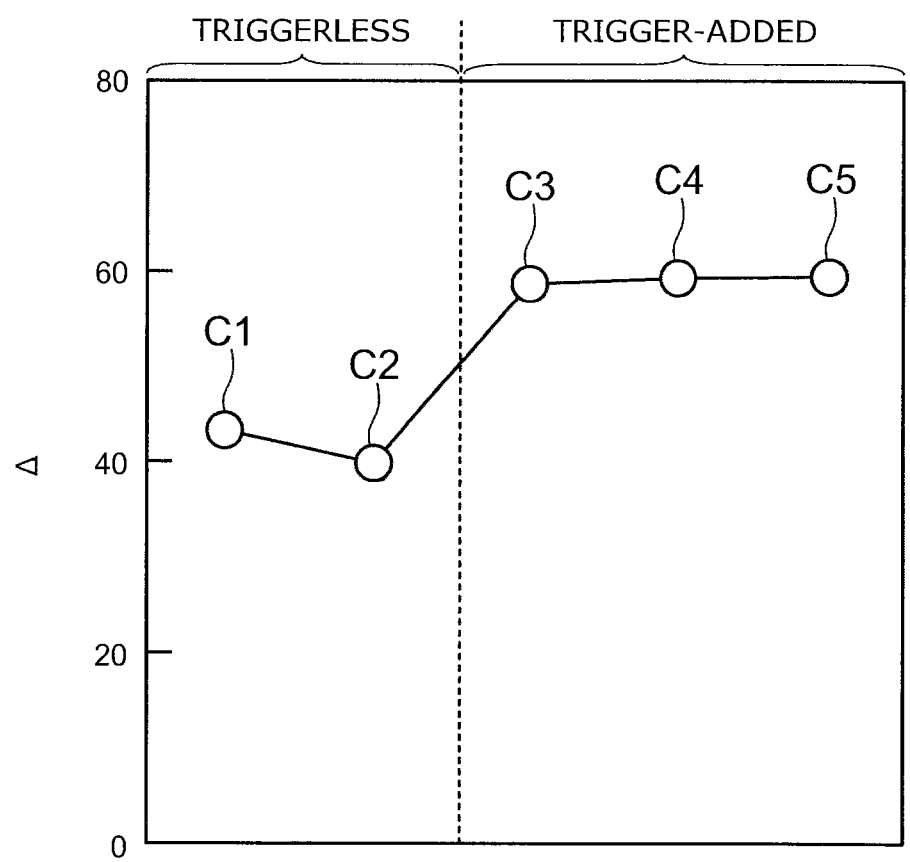
FIG. 8 is a graph showing the simulation results of the magnetic memory unit according to the first embodiment.

FIG. 8 is a graph showing the simulation results of the magnetic memory unit according to the first embodiment.

FIG. 8 shows the calculation results of the Δ value. In FIG. 8, C1 and C2 are the calculation results in the case where only the first portion 21 is provided in the second ferromagnetic layer 20. On the other hand, C3 to C5 are the calculation results in the case where the first portion 21 and the second portion 22 are provided in the second ferromagnetic layer 20. C1 is the calculation result determined analytically from the material parameters of the first portion 21. C2 is the calculation result determined from the energy barrier in the case where only the first portion 21 is provided in the second ferromagnetic layer 20. C3 is the calculation result when the magnitude of the coupling magnetic field between the first portion 21 and the second portion 22 is 5 kOe. C4 is the calculation result when the magnitude of the coupling magnetic field between the first portion 21 and the second portion 22 is 6 kOe. C5 is the calculation result when the magnitude of the coupling magnetic field between the first portion 21 and the second portion 22 is 7 kOe.

For calculation result C1 and calculation result C2 as shown in FIG. 8, the Δ value is about 40. On the other hand, for calculation result C3 to calculation result C5, the Δ value is about 60. Thus, it can be seen that the Δ value of the entirety increases by providing the trigger layer. It can be seen that good thermal stability is obtained by providing the trigger layer.

Figure 9:
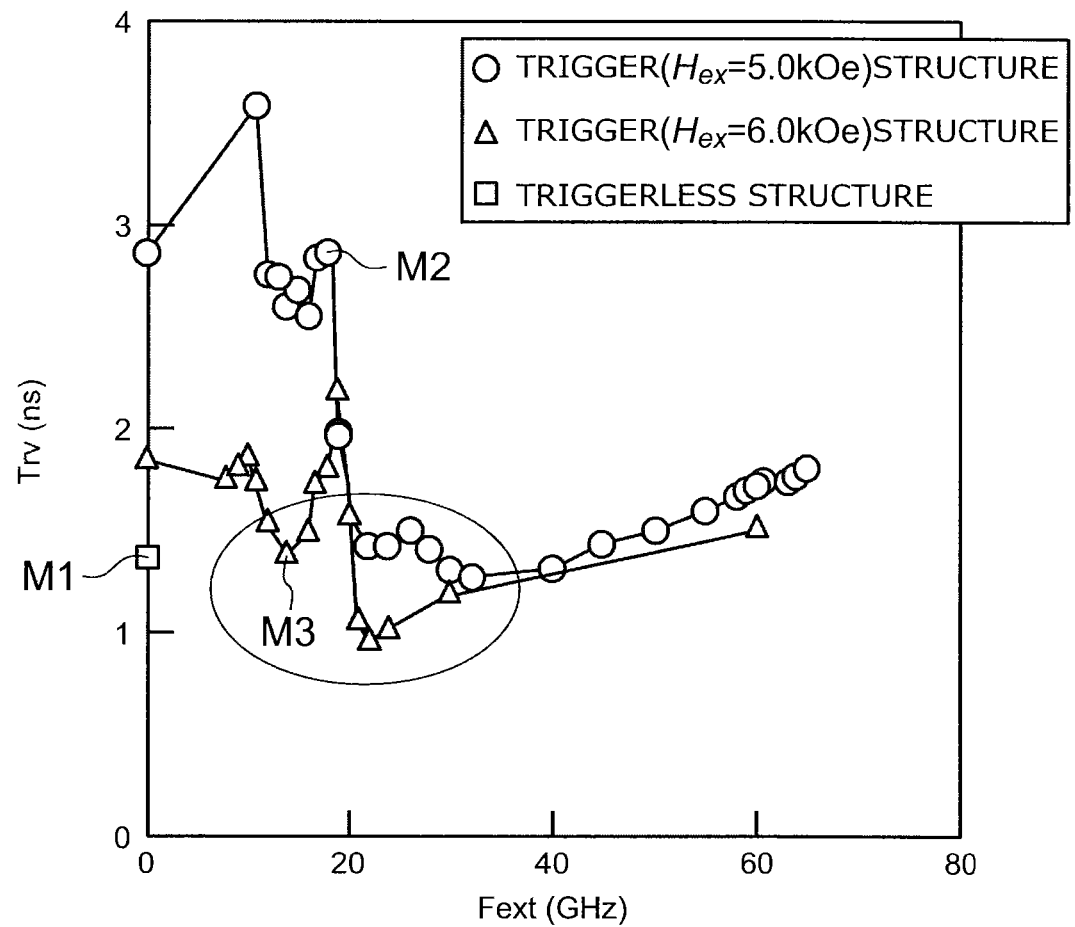
FIG. 9 is a graph showing the simulation results of the magnetic memory unit according to the first embodiment.

FIG. 9 is a graph showing the simulation results of the magnetic memory unit according to the first embodiment.

FIG. 9 shows the simulation results in which the time necessary for the magnetization reversal was calculated as the frequency of the externally-applied magnetic field was changed. In FIG. 9, the horizontal axis is a frequency Fext (GHz) of an externally-applied magnetic field; and the vertical axis is a time Try (nanoseconds) necessary for the magnetization reversal. In FIG. 9, M1 is the simulation result of the model in which only the first portion 21 is provided in the second ferromagnetic layer 20. M2 is the simulation result when the magnitude of the coupling magnetic field between the first portion 21 and the second portion 22 is 5 kOe. M3 is the simulation result when the magnitude of the coupling magnetic field between the first portion 21 and the second portion 22 is 6 kOe.

As shown in FIG. 9, for the simulation result M3, it can be seen that resonance occurs and the magnetization reversal is assisted at about 20 GHz. Conversely, the resonance frequency for the solitary first portion 21 is about 60 GHz.

Figure 10:
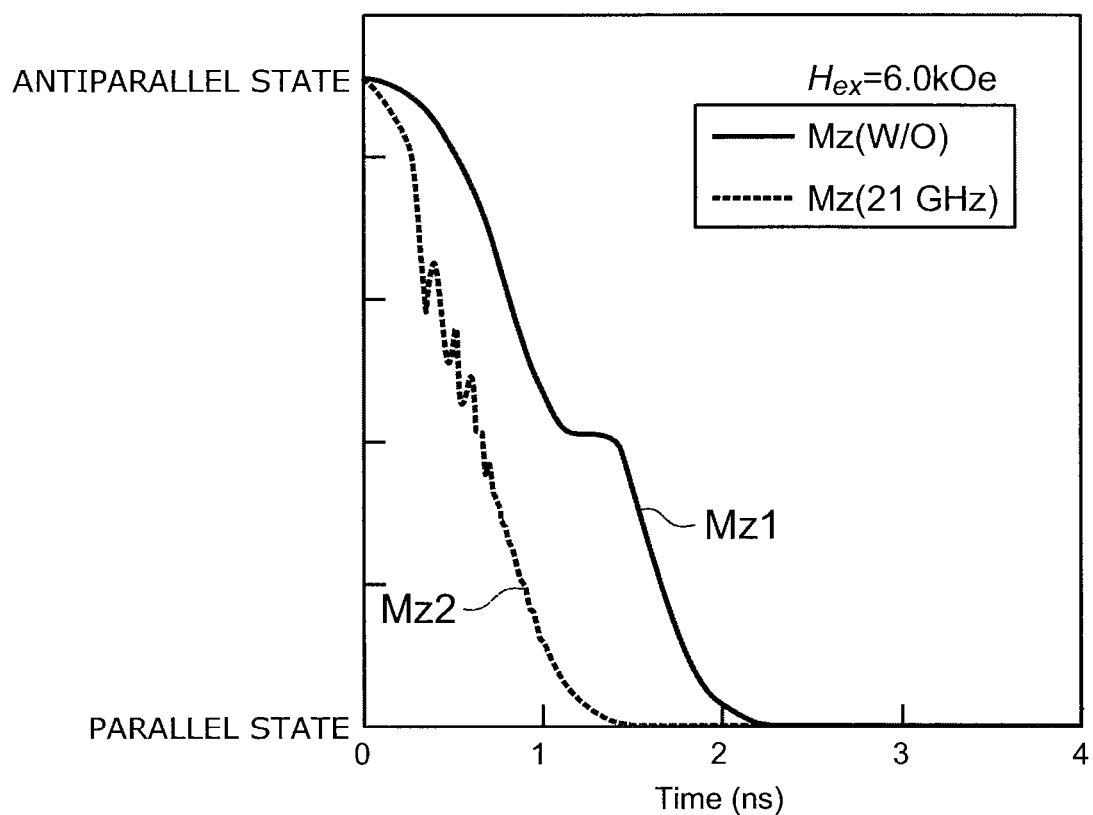
FIG. 10 is a graph showing the simulation results of the magnetic memory unit according to the first embodiment.

FIG. 10 is a graph showing the simulation results of the magnetic memory unit according to the first embodiment.

FIG. 10 shows the time response of the magnetization when the current is conducted. In FIG. 10, the horizontal axis is the supply time of the current; and the vertical axis is the state of the magnetization of the second ferromagnetic layer 20. In FIG. 10, Mz1 shows the behavior when an external magnetic field is not applied for the model in which the first portion 21 and the second portion 22 are provided in the second ferromagnetic layer 20. Mz2 shows the behavior when a rotating magnetic field of 21 GHz is applied.

For Mz1 as shown in FIG. 10, the time necessary for the magnetization reversal is about 2.3 ns. On the other hand, for Mz2, the time necessary for the magnetization reversal is about 1.5 ns. Thus, the time necessary for the magnetization reversal is reduced by applying the external magnetic field to the second ferromagnetic layer 20 in which the first portion 21 and the second portion 22 are provided. Also, for Mz1, first, the magnetization reversal of the second portion 22 occurs; the magnetization reversal of the first portion 21 occurs subsequently; and the second portion 22 and the first portion 21 reverse individually. On the other hand, for Mz2, first, the magnetization reversal of the second portion 22 which is the trigger layer occurs, bringing on the magnetization reversal of the first portion 21 which is the memory layer. The magnetization reversal of the two may occur together as a single body. Thereby, it can be seen that the response of the trigger layer assists the magnetization reversal of the memory layer and substantially reduces the magnetic resonance frequency.

Figure 11A:
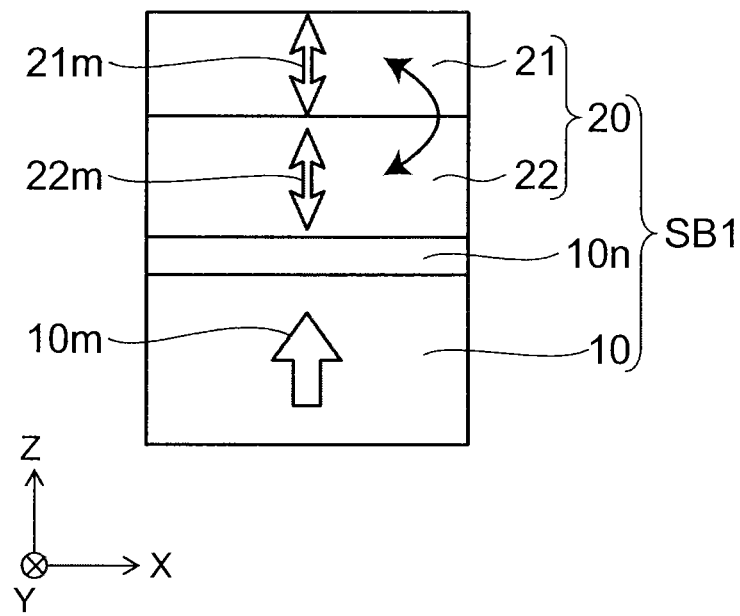
FIGS. 11A and 11B are schematic cross-sectional views showing another first stacked unit according to the first embodiment.
Figure 11B:
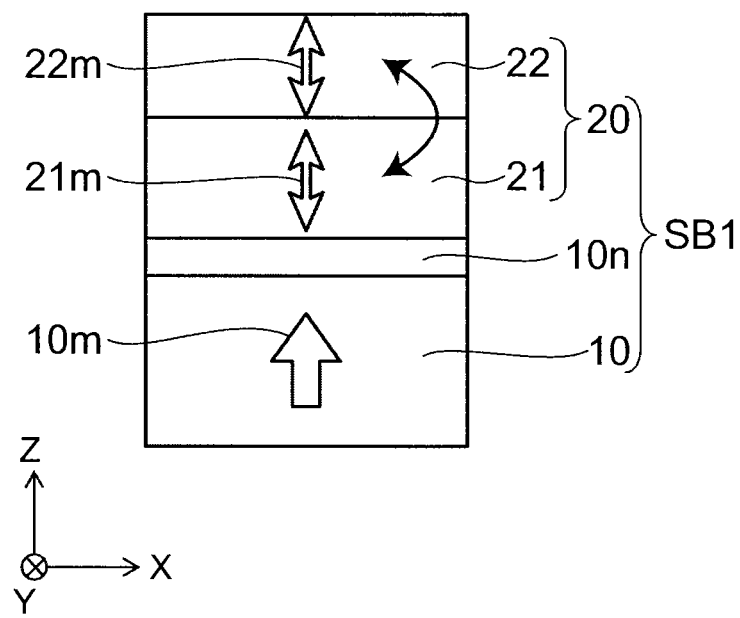

FIGS. 11A and 11B are schematic cross-sectional views showing another first stacked unit according to the first embodiment.

As shown in FIGS. 11A and 11B, there are two ways for the first portion 21 and the second portion 22 to be positioned in the first stacked unit SB1.

As shown in FIG. 11A, the second portion 22 may be provided between the first ferromagnetic layer 10 and the first portion 21.

As shown in FIG. 11B, the first portion 21 may be provided between the first ferromagnetic layer 10 and the second portion 22.

FIG. 11A is a structure in which, for example, the magnetization reversal of the magnetization 21m of the first portion 21 is assisted by the reversal of the magnetization 22m of the second portion 22 due to the spin torque from the first ferromagnetic layer 10. FIG. 11B is a structure in which, for example, the precession of the magnetization 22m of the second portion 22 is increased by the magnetic field from the second stacked unit SB2 (the STO) to assist the magnetization reversal of the magnetization 21m of the first portion 21.

Thus, by providing the trigger layer, it is possible to assist the magnetization reversal at a frequency that is lower than the resonance frequency of the memory layer. In the case where the trigger layer is provided, the magnetic resonance frequency depends on, for example, the design of the trigger layer and the strength of the ferromagnetic coupling between the trigger layer and the memory layer.

Figure 12:
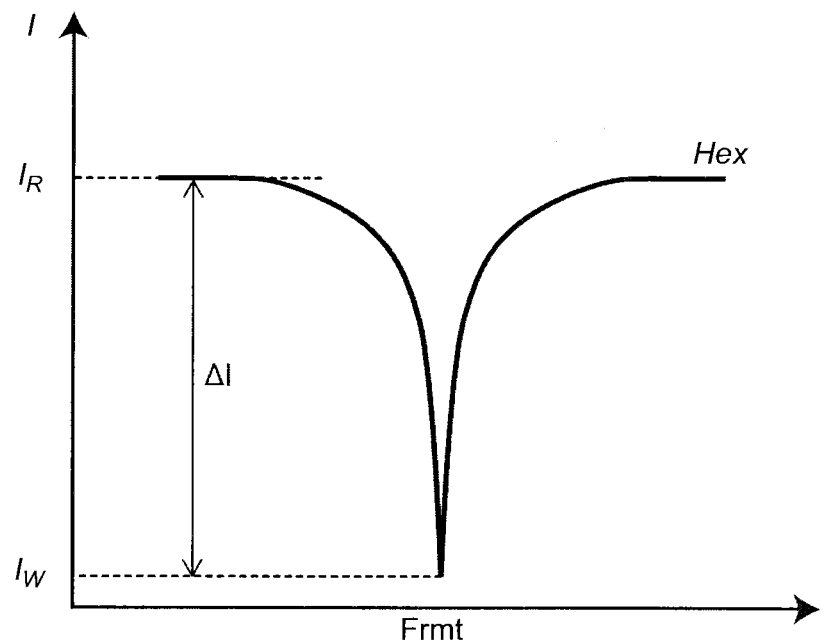
FIG. 12 is a graph showing the simulation results of the magnetic memory unit according to the first embodiment.

FIG. 12 is a graph showing the simulation results of the magnetic memory unit according to the first embodiment.

FIG. 12 shows the relationship between the writing current and the read-out current when utilizing a resonance assist structure. In FIG. 12, the horizontal axis is a frequency Frmf of the generated magnetic field of the STO; and the vertical axis is the current flowing in the magnetic memory unit MMU. In FIG. 12, $I_R$ is the read-out current; and $I_W$ is the writing current. In the resonance assist structure, miswrites can be prevented by enlarging the current margin (the Ic change rate ΔI) when reading and writing by performing the writing in the state in which the current that is necessary for the writing is lower by resonating. In the trigger layer-added structure, for example, the material selectivity of the second stacked unit SB2 increases because the frequency Frmf of the generated magnetic field of the STO can be reduced to be 30 GHz or less.

Figure 13:
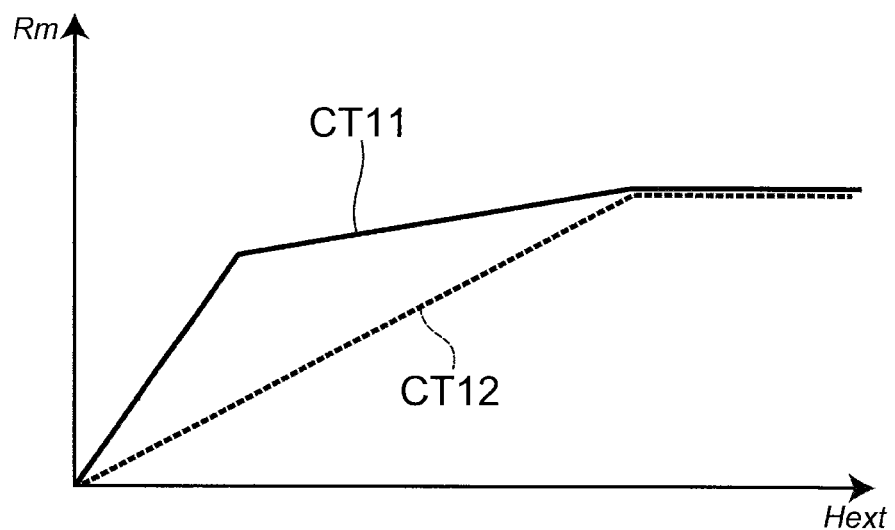
FIG. 13 is a graph showing the simulation results of the magnetic memory unit according to the first embodiment.

FIG. 13 is a graph showing the simulation results of the magnetic memory unit according to the first embodiment.

FIG. 13 shows an example of the change of the resistance value of the magnetic memory unit MMU when the external magnetic field that is applied to the magnetic memory unit MMU in the Z-axis direction is changed. In FIG. 13, the horizontal axis is an external magnetic field Hext applied to the magnetic memory unit MMU; and the vertical axis is the resistance value Rm of the magnetic memory unit MMU.

For the magnetic memory unit, there is a configuration in which a portion called an interface layer is provided adjacently to the memory layer to increase the magnetoresistance effect. In particular, in the case of the configuration shown in FIG. 11A, the position of the trigger layer is similar to the position at which the interface layer is provided. The interface layer and the trigger layer are recognizable by observing the resistance change of the magnetic memory element due to a magnetic field.

In FIG. 13, a characteristic CT11 shows the relationship between the external magnetic field Hext and the resistance value Rm of the magnetic memory unit for the configuration shown in FIG. 11A. A characteristic CT12 shows the relationship between the external magnetic field Hext and the resistance value Rm of the magnetic memory unit for a configuration in which the trigger layer of the configuration shown in FIG. 11A is replaced with an interface layer.

In the case of the interface layer as shown in FIG. 13, the resistance value increases substantially uniformly to the saturation magnetic field (Hk) because the interface layer and the memory layer respond to the magnetic field as a single body. On the other hand, in the case of the trigger layer, saturation magnetic fields exist for the trigger layer and for the memory layer because magnetization saturation of the trigger layer occurs first. Therefore, the slope of the resistance value changes partway.

Figure 14:
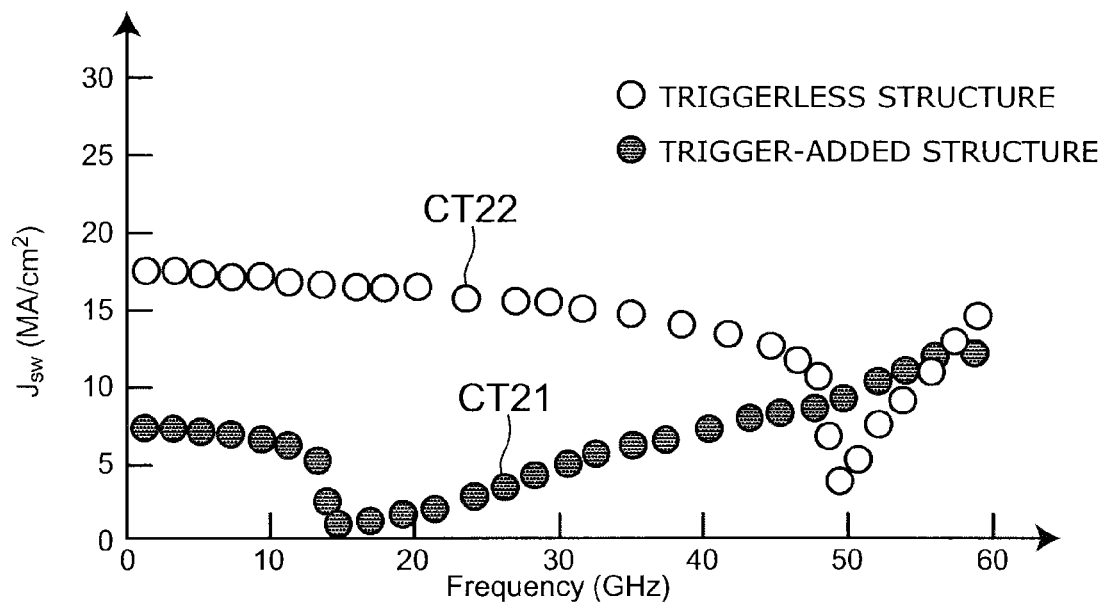
FIG. 14 is a graph showing characteristics of the magnetic memory element according to the first embodiment.

FIG. 14 is a graph showing characteristics of the magnetic memory element according to the first embodiment.

FIG. 14 shows the change of the writing current with respect to the external magnetic field for the case where there is a trigger layer in the second ferromagnetic layer 20 and the case where there is no trigger layer in the second ferromagnetic layer 20. In FIG. 14, the horizontal axis is the frequency of the external magnetic field; and the vertical axis is the current density necessary for the magnetization reversal.

The magnetic resonance frequency of the second ferromagnetic layer 20 can be measured by, for example, utilizing a damping measurement method by attaching probes to the upper and lower electrodes (e.g., the first conductive layer 81 and the second conductive layer 82) of the stacked body SB0. For example, the methods recited in H. Kubota et al., Nature Physics 4 (08) 37, J. Sankey et al., Nature Physics 4 (08) 67, etc., can be utilized as the damping measurement method.

In FIG. 14, a characteristic CT21 shows the results of the magnetic memory element 110 according to the embodiment. A characteristic CT22 shows the results of the reference example in which only the first portion 21 is provided in the second ferromagnetic layer 20.

In the reference example in which the trigger layer is not provided as shown in FIG. 14, the magnetic resonance frequency of the second ferromagnetic layer 20 is about 50 GHz. On the other hand, in the magnetic memory element 110, the magnetic resonance frequency of the second ferromagnetic layer 20 is less than 20 GHz. Thus, whether or not the trigger layer is provided in the second ferromagnetic layer 20 can be discriminated by, for example, measuring the magnetic resonance frequency of the second ferromagnetic layer 20 by utilizing the damping measurement method.

Figure 15:
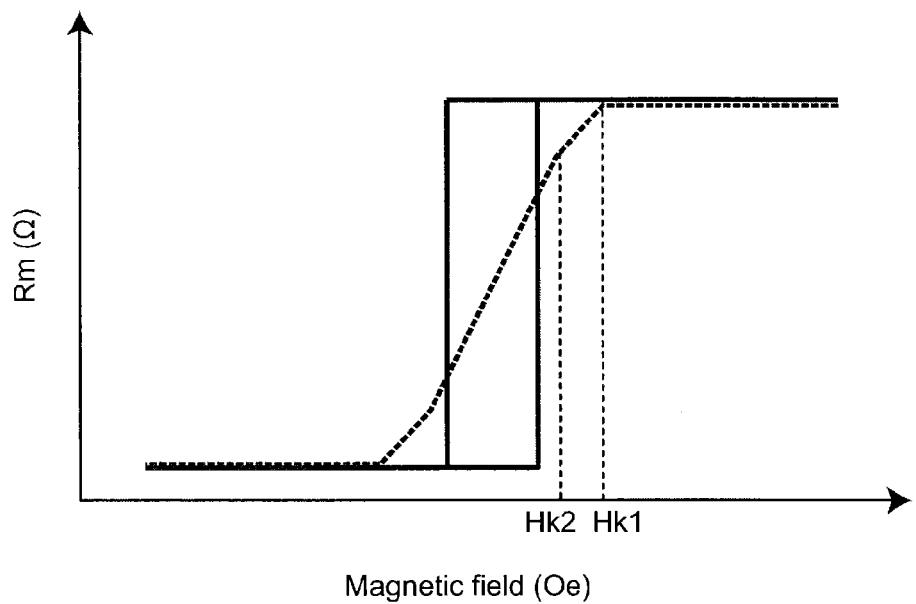
FIG. 15 is a graph showing characteristics of the magnetic memory element according to the first embodiment.

FIG. 15 is a graph showing characteristics of the magnetic memory element according to the first embodiment.

FIG. 15 shows an example of the measurement results of the effective anisotropic magnetic field Hk1 of the first portion 21 and the effective anisotropic magnetic field Hk2 of the second portion 22. In FIG. 15, the horizontal axis is the external magnetic field; and the vertical axis is the resistance value Rm of the magnetic memory unit.

The effective anisotropic magnetic field Hk1 of the first portion 21 and the effective anisotropic magnetic field Hk2 of the second portion 22 can be determined by, for example, attaching probes to the upper and lower electrodes of the stacked body SB0 and measuring the resistance of the magnetic memory unit when magnetic fields are applied in the easy axis direction and in the hard axis direction. In the example, the easy axis direction is the stacking direction SD1; and the hard axis direction is the in-plane direction SD2.

As shown in FIG. 15, the effective anisotropic magnetic field Hk1 of the first portion 21 is, for example, the value of the magnetic field when the saturation magnetic field is reached. The effective anisotropic magnetic field Hk2 of the second portion 22 is, for example, the value of the magnetic field at the point where the resistance value bends before reaching the saturation magnetic field.

Although it is desirable for the effective anisotropic magnetic field Hk1 of the first portion 21 to be distal to the effective anisotropic magnetic field Hk2 of the second portion 22, there are cases where the two match. Also, although it is desirable for the squareness ratio of the hysteresis loop in the easy axis direction to be 80% or more, there are cases where the hysteresis loop is not square.

Figure 16:
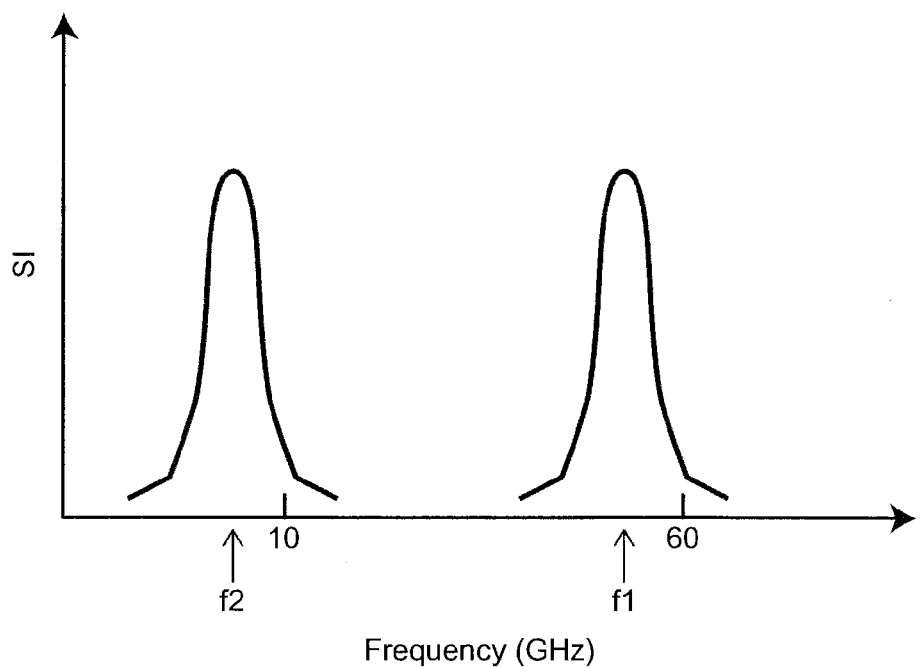
FIG. 16 is a graph showing characteristics of the magnetic memory element according to the first embodiment.

FIG. 16 is a graph showing characteristics of the magnetic memory element according to the first embodiment.

FIG. 16 shows an example of measurement results of the magnetic resonance frequency f1 of the first portion 21 and the magnetic resonance frequency f2 of the second portion 22. In FIG. 16, the horizontal axis is the measurement frequency of the measuring apparatus; and the vertical axis is a signal strength SI of the measuring apparatus.

The magnetic resonance frequency f1 of the first portion 21 and the magnetic resonance frequency f2 of the second portion 22 can be measured by, for example, a ferromagnetic resonance (FMR) measuring apparatus, etc. In the FMR measurement, for example, probes are attached to the upper and lower electrodes of the stacked body SB0; and the spectra are measured. In the case where the first portion 21 and the second portion 22 are provided in the second ferromagnetic layer 20, two or more spectra respectively corresponding to the magnetic resonance frequency f1 of the first portion 21 and the magnetic resonance frequency f2 of the second portion 22 are observed. Thereby, one of the observed spectra can be measured as the magnetic resonance frequency f1 of the first portion 21; and the other can be measured as the magnetic resonance frequency f2 of the second portion 22.

Also, the magnetic resonance frequency f1 of the first portion 21 and the magnetic resonance frequency f2 of the second portion 22 can be determined more accurately by, for example, identifying the materials included in the stacked body SB0 by composition analysis by a combination of transmission electron microscopy (TEM), electron energy-loss spectroscopy (EELS), etc.; by making single-layer films using the materials corresponding to each portion; and by measuring the magnetic resonance frequencies of the single-layer films by FMR measurement, etc.

Examples of the configurations of each layer of the magnetic memory element 110 will now be described. The following description is applicable to any magnetic memory element according to the embodiment.

It is favorable for the first ferromagnetic layer 10 and the second ferromagnetic layer 20 to include, for example, a metal material including at least one element selected from the group consisting of iron (Fe), cobalt (Co), nickel (Ni), manganese (Mn), and chrome (Cr). An alloy including the at least one selected from the group recited above and at least one metal selected from the group consisting of platinum (Pt), palladium (Pd), iridium (Ir), ruthenium (Ru), and rhodium (Rh) also may be used.

The compositions of the magnetic materials included in the first ferromagnetic layer 10 and the second ferromagnetic layer 20, the conditions of the heat treatment of the first ferromagnetic layer 10 and the second ferromagnetic layer 20, etc., are adjusted. Thereby, for example, the characteristics of the first ferromagnetic layer 10 and the second ferromagnetic layer 20 such as the magnetization amount, the magnetic anisotropy, etc., can be adjusted. For example, the first portion 21 and the second portion 22 of the second ferromagnetic layer 20 may be formed. The first ferromagnetic layer 10 and the second ferromagnetic layer 20 may include, for example, a rare earth-transition metal amorphous alloy such as TbFeCo, GdFeCo, etc. The first ferromagnetic layer 10 and the second ferromagnetic layer 20 may have, for example, a stacked structure of Co/Pt, Co/Pd, Co/Ni, etc. Co/Ru, Fe/Au, Ni/Cu, etc., become perpendicular magnetization films when combined with a foundation layer. By controlling the crystal orientation direction of the film, the first ferromagnetic layer 10 and the second ferromagnetic layer 20 may include Co/Ru, Fe/Au, Ni/Cu, etc. The first ferromagnetic layer 10 and the second ferromagnetic layer 20 may include, for example, an additive such as aluminum (Al), germanium (Ge), nitrogen (N), phosphorus (P), arsenic (As), boron (B), silicon (Si), etc.

The first nonmagnetic layer 10n may include, for example, an insulating material that behaves as a nonmagnetic tunneling barrier layer. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used. For example, the nonmagnetic tunneling barrier layer includes an insulator and is a nonmagnetic layer in which a current (a tunneling current) flows due to tunneling when a voltage is applied. The thickness of the nonmagnetic tunneling barrier layer is, for example, not more than 2 nm. Thereby, the tunneling current flows in the nonmagnetic tunneling barrier layer when the voltage is applied.

The first nonmagnetic layer 10n may include, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, etc. The first nonmagnetic layer 10n may include, for example, a nonmagnetic semiconductor (ZnOx, InMn, GaN, GaAs, TiOx, Zn, Te, or one of these doped with a transition metal), etc.

It is desirable for the thickness of the first nonmagnetic layer 10n to have a value in the range of not less than about 0.2 nanometers (nm) and not more than about 2.0 nm. Thereby, for example, a resistance that is excessively high is prevented while ensuring uniformity of the insulating film.

The second nonmagnetic layer 20n may include, for example, one selected from a nonmagnetic tunneling barrier layer and a nonmagnetic metal layer.

In the case where the nonmagnetic tunneling barrier layer is used as the second nonmagnetic layer 20n, the second nonmagnetic layer 20n may include, for example, the material described in regard to the first nonmagnetic layer 10n. In such a case, it is desirable for the thickness of the second nonmagnetic layer 20n to have a value in the range of not less than about 0.2 nm and not more than about 2.0 nm.

The nonmagnetic metal layer included in the second nonmagnetic layer 20n may include, for example, one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two elements selected from the group recited above. In the case where the nonmagnetic metal layer is used as the second nonmagnetic layer 20n, it is desirable for the thickness of the second nonmagnetic layer 20n to be not less than 1.5 nm and not more than 20 nm. Thereby, interlayer coupling does not occur between the magnetic layers; and the loss of the spin-polarized state of the conduction electrons when passing through the nonmagnetic metal layer can be suppressed.

The third ferromagnetic layer 30 may include, for example, a magnetic metal including at least one element selected from the group consisting of iron (Fe), cobalt (Co), nickel (Ni), manganese (Mn), and chrome (Cr). An alloy including at least one selected from the group recited above and at least one element selected from the group consisting of platinum (Pt), palladium (Pd), iridium (Ir), ruthenium (Ru), and rhodium (Rh) also may be used.

The composition of the magnetic materials included in the third ferromagnetic layer 30 and the heat treatment of the third ferromagnetic layer 30 are adjusted. Thereby, the characteristics of the third ferromagnetic layer 30 such as, for example, the magnetization amount, the magnetic anisotropy, etc., can be adjusted. Also, the third ferromagnetic layer 30 may include an additive such as aluminum (Al), germanium (Ge), nitrogen (N), phosphorus (P), arsenic (As), boron (B), silicon (Si), etc. The third ferromagnetic layer 30 may have a stacked structure of Co/Pt, Co/Pd, Co/Ni, etc. By controlling the crystal orientation direction of the film, the third ferromagnetic layer 30 may include Co/Ru, Fe/Au, Ni/Cu, etc.

It is favorable for the fourth ferromagnetic layer 40 to include, for example, a metal material including at least one element selected from the group consisting of iron (Fe), cobalt (Co), nickel (Ni), manganese (Mn), and chrome (Cr). An alloy including the at least one element recited above and at least one element selected from the group consisting of platinum (Pt), palladium (Pd), iridium (Ir), ruthenium (Ru), and rhodium (Rh) also may be used.

For the fourth ferromagnetic layer 40, the characteristics such as, for example, the magnetization amount, the magnetic anisotropy, etc., can be adjusted by adjusting the compositions of the magnetic materials that are included, the conditions of the heat treatment, etc. The fourth ferromagnetic layer 40 may be, for example, a rare earth-transition metal amorphous alloy such as TbFeCo, GdFeCo, etc. The fourth ferromagnetic layer 40 may have a stacked structure of Co/Pt, Co/Pd, Co/Ni, etc. Co/Ru, Fe/Au, Ni/Cu, etc., become perpendicular magnetization films when combined with a foundation layer. By controlling the crystal orientation direction of the film, the fourth ferromagnetic layer 40 may include Co/Ru, Fe/Au, Ni/Cu, etc.

The third nonmagnetic layer 30n includes, for example, a nonmagnetic metal layer.

The nonmagnetic metal layer included in the third nonmagnetic layer 30n may include, for example, at least one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), titanium (Ti), tungsten (W), platinum (Pt), bismuth (Bi), iridium (Ir), and osmium (Os) or an alloy including at least two nonmagnetic metals selected from the group recited above.

The nonmagnetic metal layer included in the third nonmagnetic layer 30n may be, for example, a conductive nitride, conductive oxide, and/or conductive fluoride including at least one element selected from the group recited above. For example, the third nonmagnetic layer 30n may include, for example, TiN, TaN, etc. The third nonmagnetic layer 30n may include a stacked film in which films of these materials are stacked. The third nonmagnetic layer 30n may include, for example, a stacked film of a Ti film/Ru film/Ti film, etc.

The third nonmagnetic layer 30n may include a material having a long spin diffusion length such as copper (Cu), etc., or a material having a short spin diffusion length such as ruthenium (Ru), etc. By the third nonmagnetic layer 30n including the material having the short spin diffusion length such as ruthenium (Ru), etc., the spin polarization of the electrons that flow can be quenched easily.

The first conductive layer 81 and the second conductive layer 82 may include, for example, a magnetic material that is conductive or a nonmagnetic material that is conductive. For example, substantially the same materials as the materials included in the third ferromagnetic layer 30 and the fourth ferromagnetic layer 40 may be used as the magnetic material that is conductive.

The nonmagnetic material that is conductive included in the first conductive layer 81 and the second conductive layer 82 may include, for example, one metal selected from the group consisting of gold (Au), copper (Cu), chrome (Cr), zinc (Zn), gallium (Ga), niobium (Nb), molybdenum (Mo), ruthenium (Ru), palladium (Pd), silver (Ag), hafnium (Hf), tantalum (Ta), titanium (Ti), tungsten (W), platinum (Pt), bismuth (Bi), and aluminum (Al) or an alloy including at least two metals selected from the group recited above.

The nonmagnetic material that is conductive included in the first conductive layer 81 and the second conductive layer 82 may be a conductive nitride, conductive oxide, and/or conductive fluoride including at least one element selected from the group recited above. The nonmagnetic material that is conductive included in the first conductive layer 81 and the second conductive layer 82 may be a carbon nanotube, a carbon nanowire, graphene, etc.

A protective film that is conductive may be included in the first conductive layer 81 and the second conductive layer 82. In such a case, the protective film may include, for example, an alloy including at least one element selected from the group consisting of tantalum (Ta), ruthenium (Ru), copper (Cu), gold (Au), silver (Ag), aluminum (Al), copper (Cu), gold (Au), silver (Ag), and aluminum (Al) or a material such as graphene, etc. It is desirable for the protective film to include one element selected from the group consisting of copper (Cu) and aluminum (Al) or an alloy including the one element when considering their electromigration resistance and low resistance.

There are cases where a transistor is directly or indirectly connected to the first conductive layer 81 and/or the second conductive layer 82. In such a case, for example, the source portion and/or the drain portion of the transistor may be used as the first conductive layer 81 and/or the second conductive layer 82 recited above. Or, in such a case, for example, contact portions connected to the source portion and/or the drain portion of the transistor may be used as the first conductive layer 81 and/or the second conductive layer 82 recited above.

The configuration of the first stacked unit SB1 and the configuration of the second stacked unit SB2 when projected onto the X-Y plane are arbitrary. The configuration of the first stacked unit SB1 and the configuration of the second stacked unit SB2 when projected onto the X-Y plane are, for example, a circle, an ellipse, a flattened circle, a polygon, etc. In the case of a polygon, it is favorable to have three or more corners such as a quadrilateral, a hexagon, etc. Also, the polygon may have rounded corners.

The configurations of the first stacked unit SB1 and the second stacked unit SB2 when projected onto a plane parallel to the Z axis (e.g., the Z-X plane or the Z-Y plane) are arbitrary. The configuration of the first stacked unit SB1 and the configuration of the second stacked unit SB2 when projected onto the plane parallel to the Z axis (the configurations cut by a plane perpendicular to the film surface) may be, for example, a tapered configuration or a reverse-tapered configuration.

An example of a method for manufacturing the magnetic memory element 110 according to the first embodiment will now be described. Other than the magnetic memory element 110, by appropriately modifying the order of making the layers, the following manufacturing method is applicable also to other magnetic memory elements according to the embodiment that are described below. In the description hereinbelow, "material A/material B" refers to material B being stacked on material A.

After forming a lower electrode (not shown) on the wafer, the wafer is disposed inside an ultra high vacuum sputtering apparatus. Ta/Ru (as both a contact layer for the lower electrode and a stopper layer), a FePt/CoFeB layer (the first ferromagnetic layer 10), MgO (the first nonmagnetic layer 10n), a CoFeB layer (the trigger layer), an CoFeB/FePd layer (the memory layer), and a Ta/Ru layer (as a contact layer, a stopper layer, and the third nonmagnetic layer 30n) on the FePd/CoFeB layer are stacked in this order on the lower electrode. It is also possible to adjust the strengths of the magnetic anisotropies in the film surface perpendicular direction of the CoFeB/FePd layer and the FePt/CoFeB layer by annealing in a magnetic field. Continuing, an FePt/CoFeB/Cu/Py layer (a magnetic field generation unit) and a Ta/Ru layer (as both an upper contact layer and a stopper layer) are stacked in this order. Thereby, a patterning body is formed.

Then, a resist mask having a diameter of 50 nm is formed by coating an EB (electron beam) resist and performing EB exposure. The portions of the patterning body that are not covered with the resist are cut away by ion milling until the Ta layer of the lower electrode contact layer-stopper layer is exposed.

Subsequently, the stacked body SB0 is covered by forming a SiN film that is used to form the protective insulating layer.

Then, a $SiO_2$ film that is used to form a filled insulating layer is formed; subsequently, planarizing by CMP (Chemical Mechanical Polishing), etc., is performed; and subsequently, the upper contact layer for the electrode is exposed by etching the entire surface by RIE (Reactive Ion Etching), etc.

Continuing, a resist is coated onto the entire surface; and the resist is patterned using a stepper lithography apparatus such that the opening of the resist corresponds to the position of the upper electrode. A Cu film is formed by being filled into the opening corresponding to the upper electrode; and the resist is removed. Thereby, the upper electrode is formed. An interconnect (not shown) that is electrically connected to the upper electrode is provided.

Thus, the magnetic memory element 110 is completed.

Figure 17:
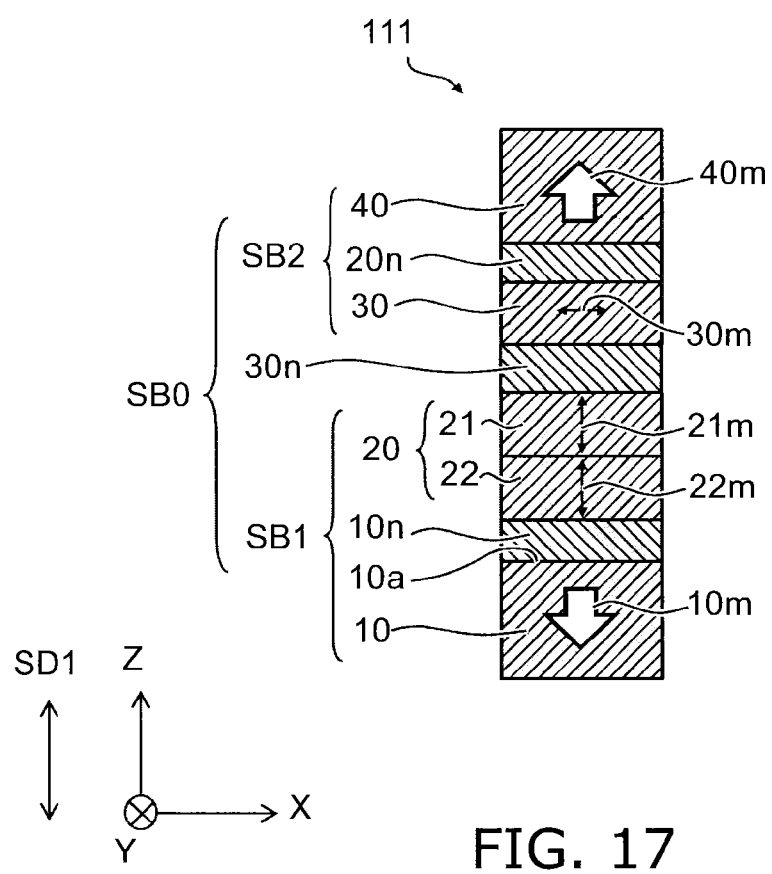
FIG. 17 is a schematic cross-sectional view showing another magnetic memory element according to the first embodiment.

FIG. 17 is a schematic cross-sectional view showing another magnetic memory element according to the first embodiment.

In the magnetic memory element 111 as shown in FIG. 17, the orientation of the magnetization 10m of the first ferromagnetic layer 10 is downward; and the orientation of the magnetization 40m of the fourth ferromagnetic layer 40 is upward. Thus, the orientation of the magnetization 10m and the orientation of the magnetization 40m may be reversely oriented with respect to the orientation of the magnetization 10*m* and the orientation of the magnetization 40*m* of the magnetic memory element 110, respectively.

For the stacking orders of the magnetic memory element 110 and the magnetic memory element 111, the distance between the second ferromagnetic layer 20 and the third ferromagnetic layer 30 is shorter than that of, for example, a configuration in which the fourth ferromagnetic layer 40 is disposed between the second ferromagnetic layer 20 and the third ferromagnetic layer 30. Thereby, the rotating magnetic field that is generated by the third ferromagnetic layer 30 can be caused to act more appropriately on the second ferromagnetic layer 20. The magnetization reversal of the second ferromagnetic layer 20 can be assisted more efficiently.

In the magnetic memory element 110 and the magnetic memory element 111, the orientation of the stacking direction SD1 component of the magnetization 10*m* of the first ferromagnetic layer 10 is the reverse of the orientation of the stacking direction SD1 component of the magnetization 40*m* of the fourth ferromagnetic layer 40. Thereby, for example, the effects of the leakage magnetic field at the position of the second ferromagnetic layer 20 caused by the magnetization 10*m* of the first ferromagnetic layer 10 and the magnetization 40*m* of the fourth ferromagnetic layer 40 can be suppressed.

In the case where, in the magnetic memory elements 110 and 111, the spin information is maintained in the third nonmagnetic layer 30*n*, the third ferromagnetic layer 30 is affected by the spin-transfer torque from the second ferromagnetic layer 20. Therefore, there are cases where the controllability of the magnetization rotation of the third ferromagnetic layer 30 degrades.

In such a case, it is desirable for example, a film having a short spin diffusion length (a material having a spin-quenching function) such as ruthenium (Ru), etc., or a layer having a structure having a short spin diffusion length to be used as the third nonmagnetic layer 30*n*. Thereby, the degradation of the controllability of the magnetization rotation of the third ferromagnetic layer 30 can be suppressed.

In other words, the strength of the spin-transfer torque to cause the magnetization 30*m* of the third ferromagnetic layer 30 to precess is determined by the spin polarization at the fourth ferromagnetic layer 40. In this configuration, it is possible to independently control the magnetization 30*m* of the third ferromagnetic layer 30 without being affected by the spins (the spin-transfer torque) of other electrons.

A metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group may be used as the material for the third nonmagnetic layer 30*n* to obtain such a spin-quenching effect.

It is desirable for the thickness of the third nonmagnetic layer 30*n* to be set to a value such that the second ferromagnetic layer 20 and the third ferromagnetic layer 30 do not have interlayer magnetic coupling. Specifically, it is desirable for the thickness of the third nonmagnetic layer 30*n* to be set to be 1.4 nm or more.

In the case where the thickness of the third nonmagnetic layer 30*n* is set to be 1.4 nm or more, the interlayer coupling between the second ferromagnetic layer 20 and the third ferromagnetic layer 30 can be suppressed; and the spin polarization of the conduction electrons of the third nonmagnetic layer 30*n* that pass through the interior and interface of the third nonmagnetic layer 30*n* can be quenched. Further, the third nonmagnetic layer 30*n* can prevent the change of the precession of the third ferromagnetic layer 30 due to the orientations of the magnetization 21*m* and the magnetization 22*m* of the second ferromagnetic layer 20.

On the other hand, in the case where the thickness of the third nonmagnetic layer 30*n* exceeds 20 nm, pillar configurations of the multilayered film become difficult to form. Moreover, the strength of the rotating magnetic field generated by the third ferromagnetic layer 30 attenuates at the position of the second ferromagnetic layer 20. Therefore, it is desirable for the thickness of the third nonmagnetic layer 30*n* to be set to be 20 nm or less.

Other than the single-layer film described above, a stacked film may be used as the third nonmagnetic layer 30*n*. The stacked film may have, for example, a stacked configuration of a copper (Cu) layer stacked on at least one side of a layer including a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group.

The stacked film included in the third nonmagnetic layer 30*n* may have, for example, a stacked configuration including a first layer and a second layer stacked on at least one side of the first layer, where the first layer includes a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group, and the second layer includes an oxide including at least one element selected from the group consisting of aluminum (Al), magnesium (Mg), titanium (Ti), iron (Fe), cobalt (Co), nickel (Ni), vanadium (V), chrome (Cr), tantalum (Ta), tungsten (W), and ruthenium (Ru).

Figure 18:
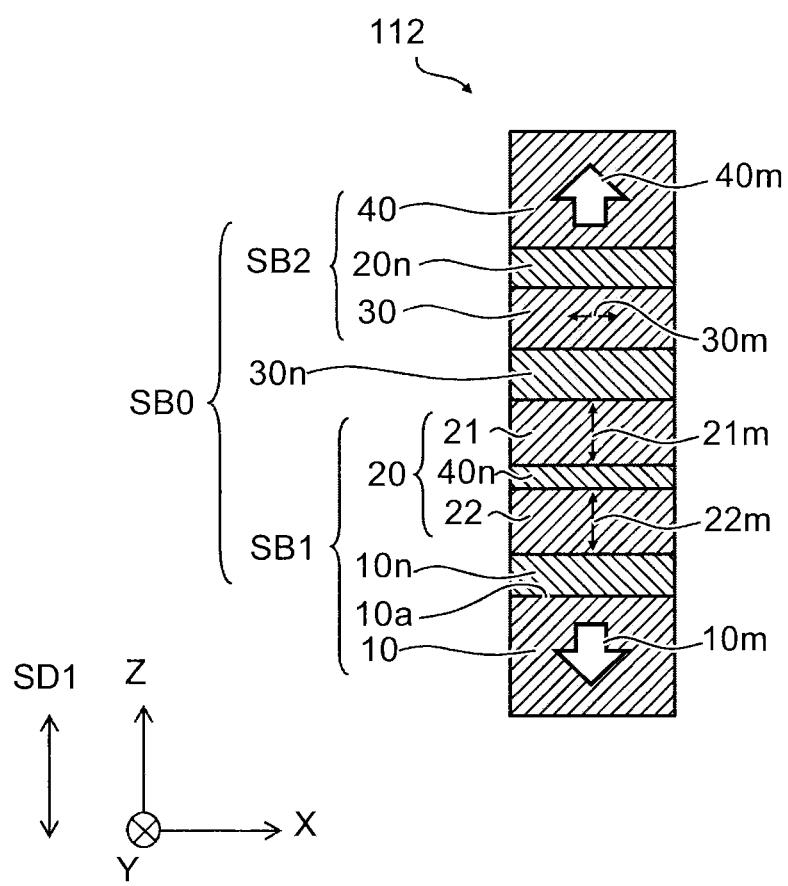
FIG. 18 is a schematic cross-sectional view showing another magnetic memory element according to the first embodiment.

FIG. 18 is a schematic cross-sectional view showing another magnetic memory element according to the first embodiment.

In the magnetic memory element 112 as shown in FIG. 18, the second ferromagnetic layer 20 further includes a fourth nonmagnetic layer 40*n*. The fourth nonmagnetic layer 40*n* is provided between the first portion 21 and the second portion 22. Thus, the magnetization 21*m* of the first portion 21 may be ferromagnetically coupled with the magnetization 22*m* of the second portion 22 via the fourth nonmagnetic layer 40*n*.

The fourth nonmagnetic layer 40*n* may include, for example, a nonmagnetic metal layer.

The nonmagnetic metal layer included in the fourth nonmagnetic layer 40*n* may include at least one nonmagnetic metal selected from the group consisting of copper (Cu), silver (Ag), gold (Au), chrome (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), and osmium (Os) or an alloy including at least two elements selected from the group recited above.

The fourth nonmagnetic layer 40*n* may include a material having a long spin diffusion length such as copper (Cu), etc., or a material having a short spin diffusion length such as ruthenium (Ru), etc. In the case where it is desirable to eliminate the effect of the spin-polarized electrons being injected, it is desirable for the fourth nonmagnetic layer 40*n* to include the material having the short spin diffusion length such as ruthenium (Ru), etc.

FIGS. 19A to 19J are schematic cross-sectional views showing other magnetic memory elements according to the first embodiment.

In magnetic memory elements 121 to 126 as shown in FIGS. 19A to 19F, the second ferromagnetic layer 20, the first nonmagnetic layer 10*n*, the first ferromagnetic layer 10, the third nonmagnetic layer 30n, the fourth ferromagnetic layer 40, the second nonmagnetic layer 20n, and the third ferromagnetic layer 30 are stacked in this order. Thus, the stacking order of the stacked body SB0 may be the order shown in FIGS. 19A to 19F.

In the magnetic memory element 121 and the magnetic memory element 122, the orientation of the stacking direction SD1 component of the magnetization 10m of the first ferromagnetic layer 10 is the reverse of the orientation of the stacking direction SD1 component of the magnetization 40m of the fourth ferromagnetic layer 40. Thereby, for example, the effects of the leakage magnetic field at the position of the second ferromagnetic layer 20 caused by the magnetization 10m of the first ferromagnetic layer 10 and the magnetization 40m of the fourth ferromagnetic layer 40 can be suppressed.

In the magnetic memory element 121 and the magnetic memory element 122, the first ferromagnetic layer 10 and the fourth ferromagnetic layer 40 may have antiferromagnetic coupling via the third nonmagnetic layer 30n. Thus, the structure in which the directions of the magnetizations are antiparallel to each other and antiferromagnetically coupled to each other via the nonmagnetic layer is called a synthetic antiferromagnetic (SAF) structure. In the example, the stacked structure of a first magnetic layer (e.g., the first ferromagnetic layer 10)/nonmagnetic layer (e.g., the third nonmagnetic layer 30n)/second magnetic layer (e.g., the fourth ferromagnetic layer 40) corresponds to a SAF structure.

By using the SAF structure, the mutual magnetization fixing power is increased; and the immunity to external magnetic fields and the thermal stability can be improved. In this structure, the leakage magnetic field at the position of the magnetic memory layer (e.g., the second ferromagnetic layer 20) in the direction perpendicular to the film surface can be substantially zero.

The nonmagnetic layer (the intermediate layer) of the SAF structure may include a metal material such as ruthenium (Ru), iridium (Ir), osmium (Os), etc. The thickness of the nonmagnetic layer is set to be, for example, 3 nm or less. Thereby, a sufficiently strong antiferromagnetic coupling is obtained via the nonmagnetic layer.

In other words, the third nonmagnetic layer 30n includes, for example, one metal selected from the group consisting of ruthenium (Ru), osmium (Os), and iridium (Ir) or an alloy including at least two metals selected from the group. The thickness of the third nonmagnetic layer 30n is, for example, not more than 3 nm.

In the magnetic memory element 123 and the magnetic memory element 124, the orientation of the stacking direction SD1 component of the magnetization 10m of the first ferromagnetic layer 10 is the same as the orientation of the stacking direction SD1 component of the magnetization 40m of the fourth ferromagnetic layer 40. Thus, the orientation of the magnetization 10m may be parallel to the orientation of the magnetization 40m.

In the magnetic memory element 125 and the magnetic memory element 126, the orientation of the magnetization 10m and the orientation of the magnetization 40m are tilted with respect to the stacking direction SD1. The orientation of the magnetization 10m and the orientation of the magnetization 40m may not be parallel to the stacking direction SD1. It is sufficient for the orientation of the magnetization 10m and the orientation of the magnetization 40m to have at least stacking direction SD1 components.

Figures 19A, 19B, 19C, 19D:
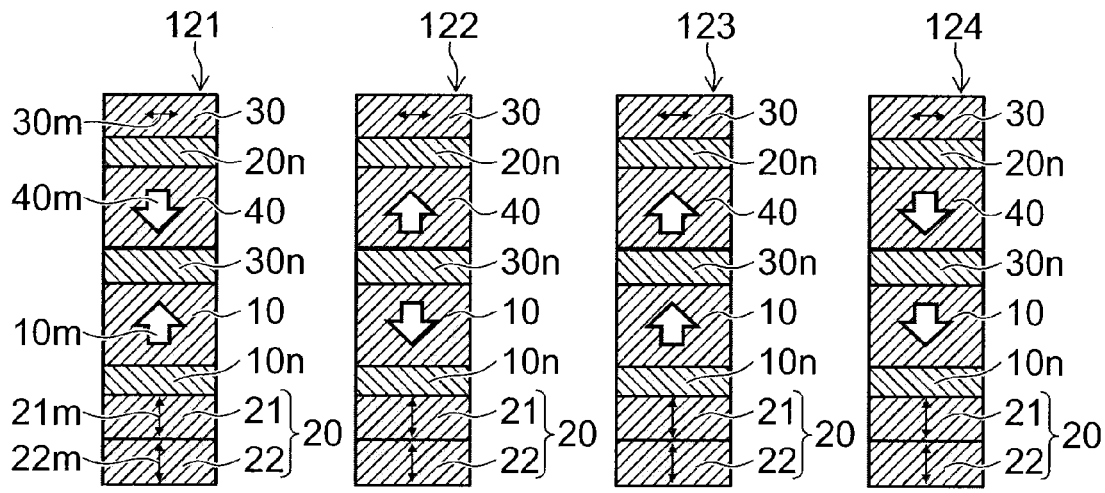
FIGS. 19A to 19J are schematic cross-sectional views showing other magnetic memory elements according to the first embodiment.
Figures 19E, 19F, 19G, 19H:
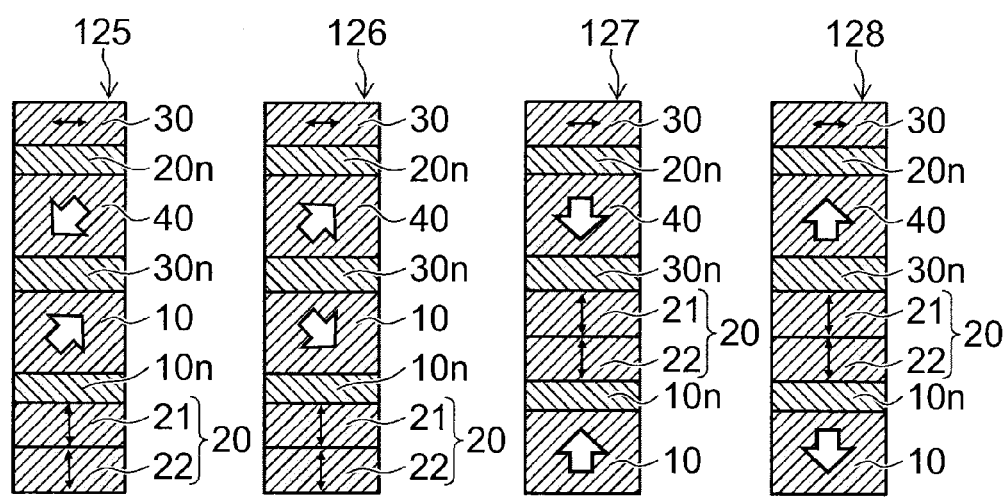

In a magnetic memory element 127 and a magnetic memory element 128 as shown in FIGS. 19G and 19H, the first ferromagnetic layer 10, the first nonmagnetic layer 10n, the second ferromagnetic layer 20, the third nonmagnetic layer 30n, the fourth ferromagnetic layer 40, the second nonmagnetic layer 20n, and the third ferromagnetic layer 30 are stacked in this order. Thus, the stacking order of the stacked body SB0 may be the order shown in FIGS. 19G and 19H.

Figures 19I, 19J:
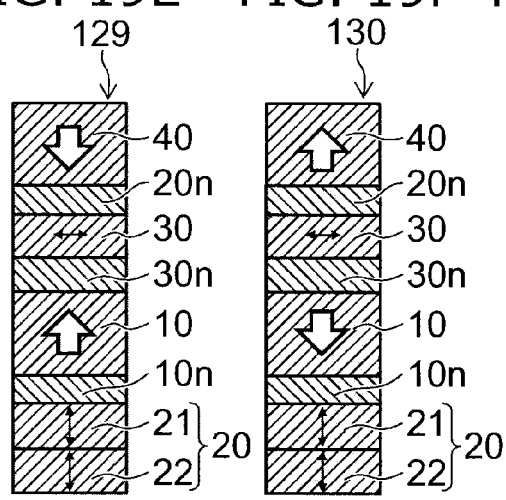

In a magnetic memory element 129 and a magnetic memory element 130 as shown in FIGS. 19I and 19J, the second ferromagnetic layer 20, the first nonmagnetic layer 10n, the first ferromagnetic layer 10, the third nonmagnetic layer 30n, the third ferromagnetic layer 30, the second nonmagnetic layer 20n, and the fourth ferromagnetic layer 40 are stacked in this order. Thus, the stacking order of the stacked body SB0 may be the order shown in FIGS. 19I and 19J.

In the magnetic memory elements 121 to 130, a writing current $I_W$ is caused to flow in the stacked body SB0 via the first conductive layer 81 and the second conductive layer 82. The orientation of the writing current $I_W$ is arbitrary. The orientation of the rotating magnetic field generated in the third ferromagnetic layer 30 can match the orientation of the precession of the magnetization 21m of the first portion 21 of the second ferromagnetic layer 20 by applying a magnetic field that is reversely oriented with respect to the orientation of the magnetization 40m of the fourth ferromagnetic layer 40.

Figure 20:
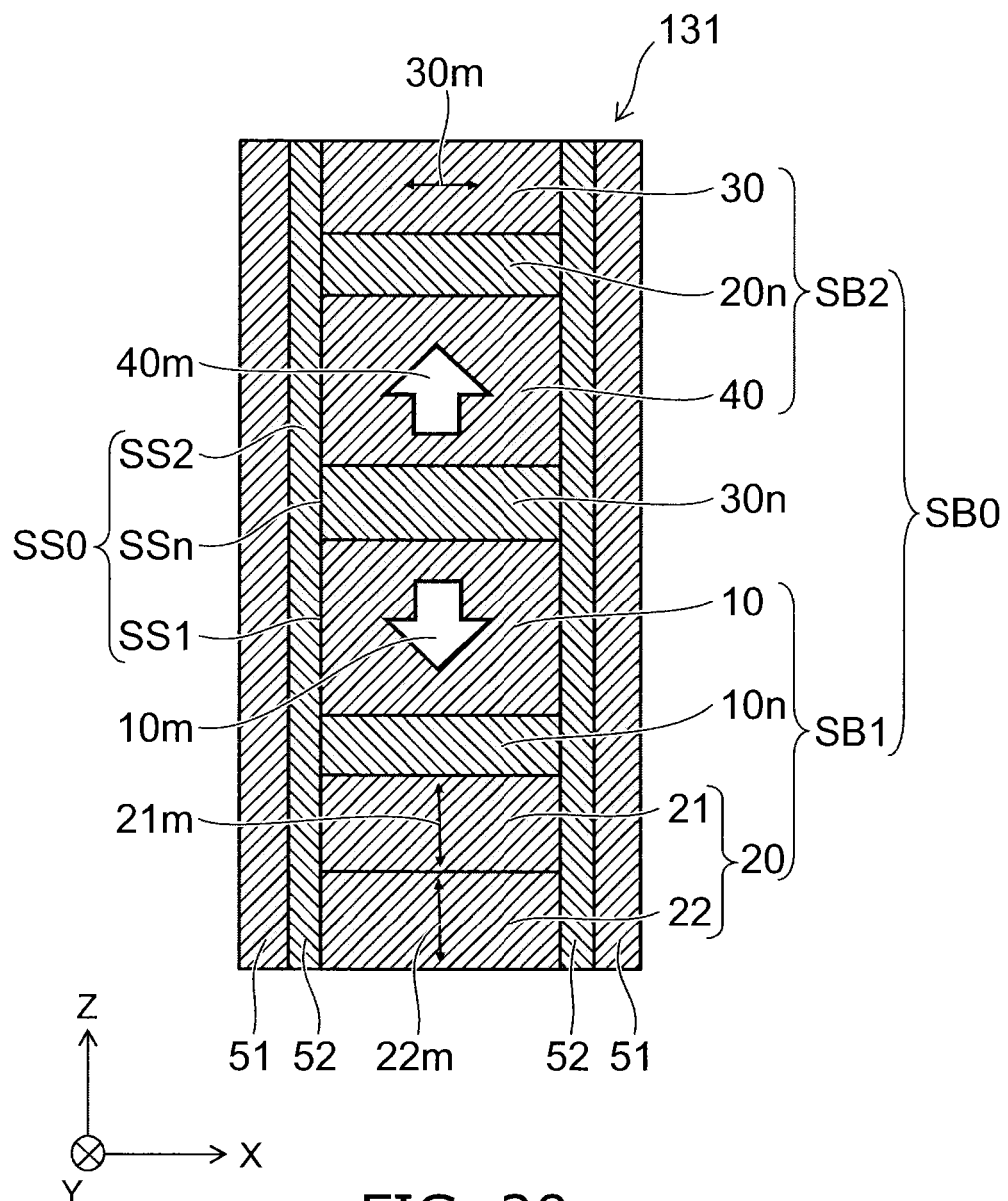
FIG. 20 is a schematic cross-sectional view showing another magnetic memory element according to the first embodiment.

FIG. 20 is a schematic cross-sectional view showing another magnetic memory element according to the first embodiment.

As shown in FIG. 20, the magnetic memory element 131 further includes a magnetic shield 51. The stacked body SB0 has a side surface SS0 extending in the stacking direction SD1. The first stacked unit SB1 has a side surface SS1 (a first side surface) extending in the stacking direction SD1. The second stacked unit SB2 has a side surface SS2 (a second side surface) extending in the stacking direction SD1. The third nonmagnetic layer 30n has a side surface SSn extending in the stacking direction SD1. Herein, "extending in the stacking direction SD1" also includes the state of being non-parallel to the stacking direction SD1. To be "extending in the stacking direction SD1," it is sufficient to have at least a component extending in the stacking direction SD1. In other words, it is sufficient for a "surface extending in the stacking direction SD1" not to be a surface orthogonal to the stacking direction SD1.

The magnetic shield 51 covers at least a portion of the side surface SS0 of the stacked body SB0. In other words, the magnetic shield 51 opposes at least a portion of the side surface SS0 of the stacked body SB0. The side surface SS0 of the stacked body SB0 includes, for example, the side surface SS1 (the first side surface) of the first stacked unit SB1, the side surface SS2 (the second side surface) of the second stacked unit SB2, and the side surface SSn of the third nonmagnetic layer 30n. In the example, the magnetic shield 51 covers the side surface SS1, the side surface SS2, and the side surface SSn. The configuration of the magnetic shield 51 projected onto the X-Y plane is, for example, an annular configuration around the stacked body SB0.

The magnetic memory element 131 further includes a protective layer 52 provided between the magnetic shield 51 and the side surface SS0 of the stacked body SB0. It is desirable for the thickness of the protective layer 52 to be substantially the same as or greater than the distance in the Z-axis direction from the Z-axis direction center of the second ferromagnetic layer 20 to the Z-axis direction center of the third ferromagnetic layer 30. The distance in the Z-axis direction from the Z-axis direction center of the second ferromagnetic layer 20 to the Z-axis direction center of the third ferromagnetic layer 30 is, for example, shortest in the configuration of the magnetic memory element 110 and the configuration of the magnetic memory element 111 and longest in the configurations of the magnetic memory elements 121 to 126. It is desirable for the thickness of the protective layer 52 to be, for example, not less than 2 nm and not more than 30 nm.

For example, the side surface SS1 of the first stacked unit SB1 and the side surface SS2 of the second stacked unit SB2 are covered with the magnetic shield 51 of permalloy (Py), etc., with the protective layer 52 of SiN, $Al_2O_3$, etc., interposed. Thereby, for example, negative effects of the leakage magnetic field from an adjacent magnetic memory element 131 on the operations of the first stacked unit SB1 and the second stacked unit SB2 are suppressed in the case where multiple magnetic memory elements 131 are arranged. For example, the fluctuation of the reversal current between bits is suppressed because the effective magnetic field acting on the first stacked unit SB1 is substantially the same between the memory cells (the stacked bodies SB0). Similarly, the fluctuation of the generation current of the second stacked unit SB2 is suppressed. The action of the leakage magnetic field from the first stacked unit SB1 and the second stacked unit SB2 on the adjacent magnetic memory element can be suppressed. As a result, the multiple magnetic memory elements can be disposed proximally to each other to increase the integration. For example, the bit density of the nonvolatile memory device can be increased.

The magnetic shield 51 may include, for example, one metal selected from the group consisting of iron (Fe), cobalt (Co), nickel (Ni), manganese (Mn), and chrome (Cr) or an alloy including at least two metals selected from the group. The magnetic shield 51 may be, for example, an alloy including at least one metal selected from the group consisting of iron (Fe), cobalt (Co), nickel (Ni), manganese (Mn), and chrome (Cr) and at least one metal selected from the group consisting of platinum (Pt), palladium (Pd), iridium (Ir), ruthenium (Ru), and rhodium (Rh).

The characteristics of the magnetic shield 51 can be adjusted by adjusting the composition of the magnetic material included in the magnetic shield 51 and/or the conditions of the heat treatment. The magnetic shield 51 may be, for example, a rare earth-transition metal amorphous alloy of TbFeCo, GdFeCo, etc. The magnetic shield 51 may include a stacked structure of Co/Pt, Co/Pd, Co/Ni, etc.

The protective layer 52 may include, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe). The protective layer 52 may include, for example, SiN.

An example of a method for manufacturing the magnetic memory element 131 shown in FIG. 20 will now be described.

First, a lower electrode (not shown) is formed on a wafer; and subsequently, the wafer is disposed inside an ultra-high vacuum sputtering apparatus. Then, a Ta/Ru layer (as both a contact layer for the electrode and a stopper layer), a CoFeB layer (the trigger layer), an FePd/CoFeB layer (the memory layer), MgO (the first nonmagnetic layer 10$n$), a CoFeB/FePt layer (the first ferromagnetic layer 10), Ru (the third nonmagnetic layer 30$n$), an FePt/CoFeB/Cu/Py layer (the magnetic field generation unit), and a layer of Ta (a contact layer for the electrode) on the FePt/CoFeB/Cu/Py layer are stacked in this order on the lower electrode. Here, it is also possible to adjust the strengths of the magnetic anisotropies in the film surface perpendicular direction of the FePd/CoFeB layer and the CoFeB/FePt layer by annealing in a magnetic field.

Then, a resist mask having a diameter of 50 nm is formed by coating an EB resist and performing EB exposure. The portion not covered with the resist is cut away by ion milling until the Ta layer that is on the lower electrode-stopper layer is exposed.

Continuing, after forming a SiN layer as the protective layer 52, a Py layer that behaves as the magnetic shield 51 is formed. Etch-back is performed such that the Py layer remains on the side wall of the magnetic memory element.

Then, a $SiO_2$ film is formed to insulate and bury the magnetic memory element; subsequently, planarizing is performed by CMP, etc.; and the contact layer for the electrode is exposed by etching the entire surface by RIE, etc.

Continuing, a resist is coated onto the entire surface; and the resist is patterned using a stepper lithography apparatus such that the resist does not cover the position of the upper electrode. Cu is formed as a film to fill the opening corresponding to the upper electrode; and the resist is removed. Electrical input/output can be performed by providing a not-shown interconnect to the upper electrode.

Thus, the magnetic memory element 131 is completed.

Figure 21A:
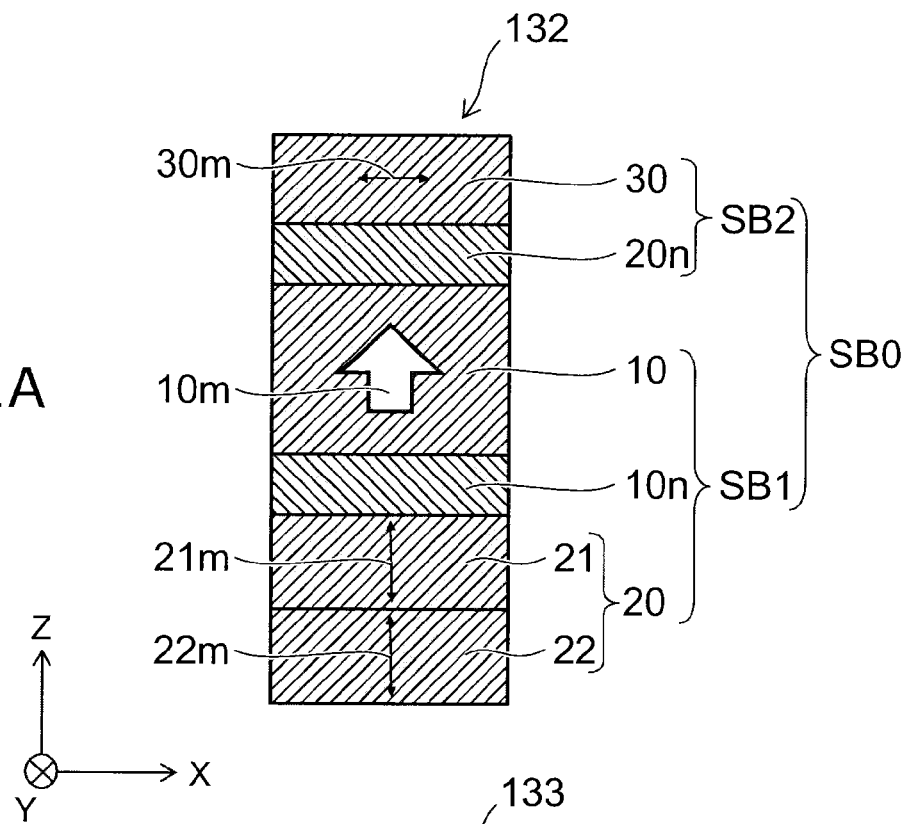
FIGS. 21A and 21B are schematic cross-sectional views showing other magnetic memory elements according to the first embodiment.
Figure 21B:
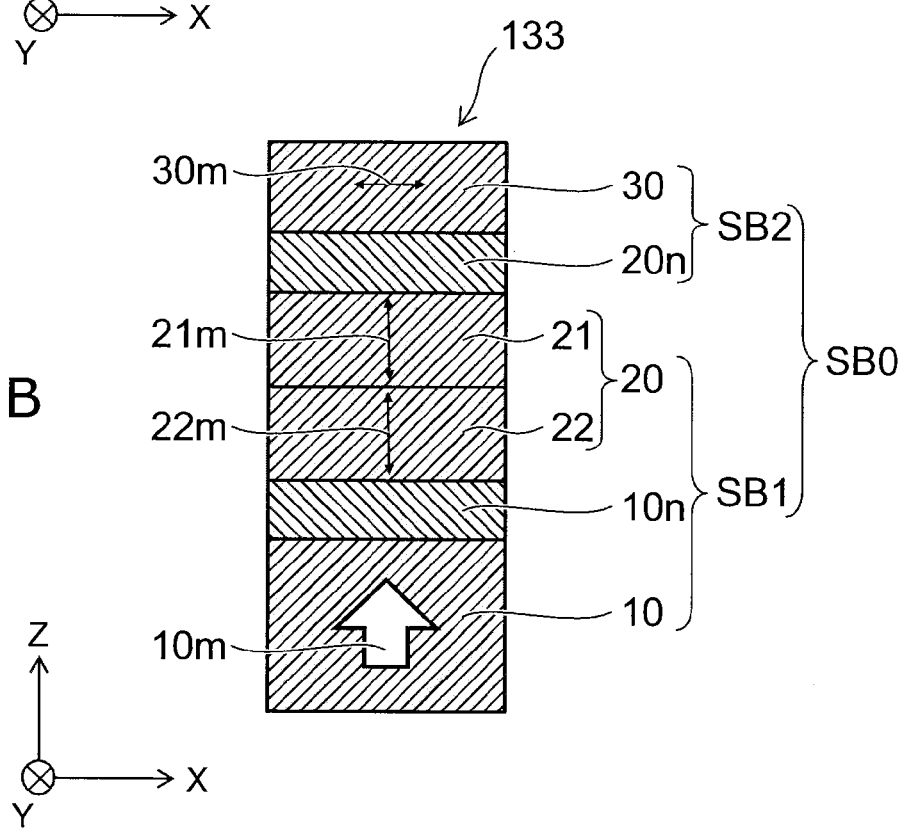

FIGS. 21A and 21B are schematic cross-sectional views showing other magnetic memory elements according to the first embodiment.

In a magnetic memory element 132 and a magnetic memory element 133 as shown in FIGS. 21A and 21B, the fourth ferromagnetic layer 40 and the third nonmagnetic layer 30$n$ are omitted. In the magnetic memory element 132 and the magnetic memory element 133, the second nonmagnetic layer 20$n$ is provided between the first stacked unit SB1 and the third ferromagnetic layer 30. In the magnetic memory element 132, the second ferromagnetic layer 20, the first nonmagnetic layer 10$n$, the first ferromagnetic layer 10, the second nonmagnetic layer 20$n$, and the third ferromagnetic layer 30 are stacked in this order. In the magnetic memory element 133, the first ferromagnetic layer 10, the first nonmagnetic layer 10$n$, the second ferromagnetic layer 20, the second nonmagnetic layer 20$n$, and the third ferromagnetic layer 30 are stacked in this order.

In the magnetic memory element 132 and the magnetic memory element 133, the first ferromagnetic layer 10 is used as both the pinned layer of a MTJ and as the pinned layer of a STO. In the magnetic memory element 132 and the magnetic memory element 133 as well, for example, misoperations can be suppressed by providing the trigger layer in the second ferromagnetic layer 20. Misoperations can be suppressed in the nonvolatile memory device 610. Thus, the fourth ferromagnetic layer 40 and the third nonmagnetic layer 30$n$ may be provided in the magnetic memory element if necessary and are omissible.

Figure 22A:
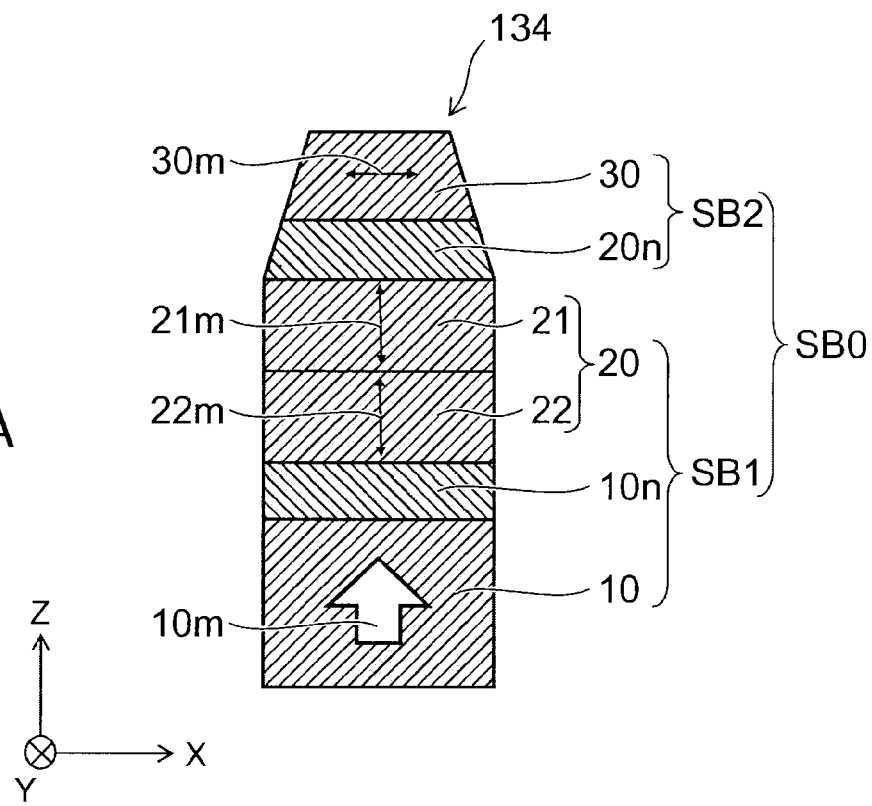
FIGS. 22A and 22B are schematic cross-sectional views showing other magnetic memory elements according to the first embodiment.
Figure 22B:
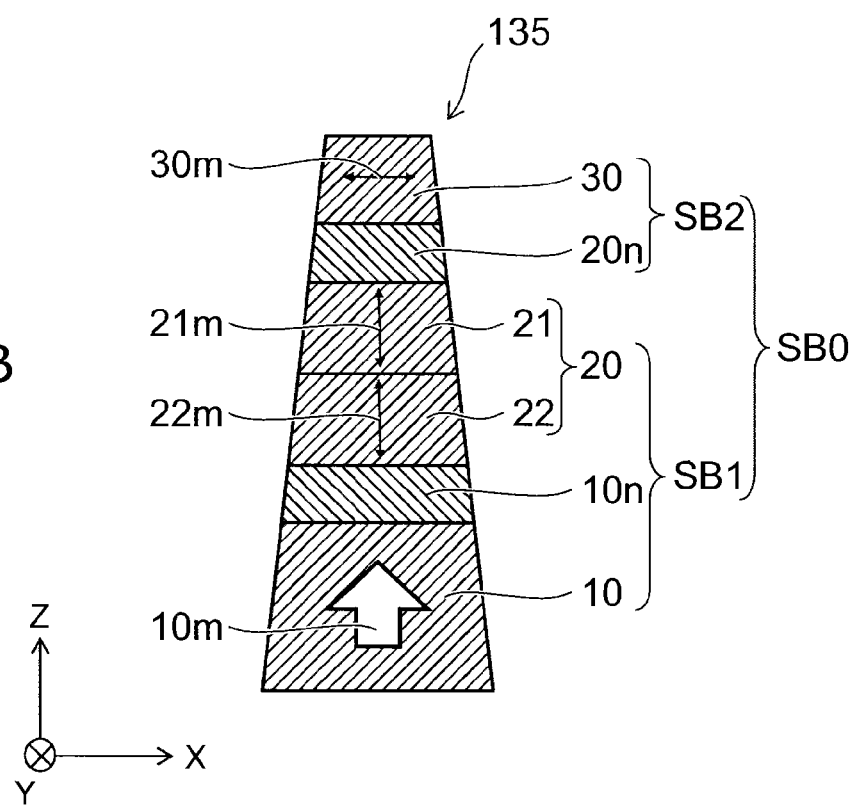

FIGS. 22A and 22B are schematic cross-sectional views showing other magnetic memory elements according to the first embodiment.

In the magnetic memory element 134 as shown in FIG. 22A, the width (the length in a direction perpendicular to the stacking direction SD1) of the second stacked unit SB2 decreases continuously in the upward direction. In other words, the second stacked unit SB2 has a tapered configuration. The second stacked unit SB2 has, for example, a truncated pyramid configuration. The configurations of the second ferromagnetic layer 20, etc., projected onto the X-Y plane are, for example, circles. Accordingly, the second stacked unit SB2 has, for example, a truncated circular conical configuration. Accordingly, in the example, the length of the second stacked unit SB2 in the direction perpendicular to the stacking direction SD1 is shorter than the length of the second ferromagnetic layer 20 in the direction perpendicular to the stacking direction SD1. For example, the length of the third ferromagnetic layer 30 in the direction perpendicular to the stacking direction SD1 is shorter than the length of the second ferromagnetic layer 20 in the direction perpendicular to the stacking direction SD1.

For example, the Δ value of the STO can be smaller for the magnetic memory element 134 than for, for example, the magnetic memory element 133, etc. Thereby, for example, it is easier to cause the magnetization 30*m* of the third ferromagnetic layer 30 to precess.

In the magnetic memory element 135 as shown in FIG. 22B, the width of the stacked body SB0 decreases in the direction from the first stacked unit SB1 toward the second stacked unit SB2. In other words, in the magnetic memory element 135, the first stacked unit SB1 also has a tapered configuration. In the magnetic memory element 135, the width of the first ferromagnetic layer 10 decreases in the direction from the first stacked unit SB1 toward the second stacked unit SB2. For example, the width of the first ferromagnetic layer 10 decreases continuously. In the example, the width of the first ferromagnetic layer 10 decreases continuously in the upward direction. The first ferromagnetic layer 10 has, for example, a truncated pyramid configuration. Thus, the first stacked unit SB1 may have a tapered configuration.

Figure 23:
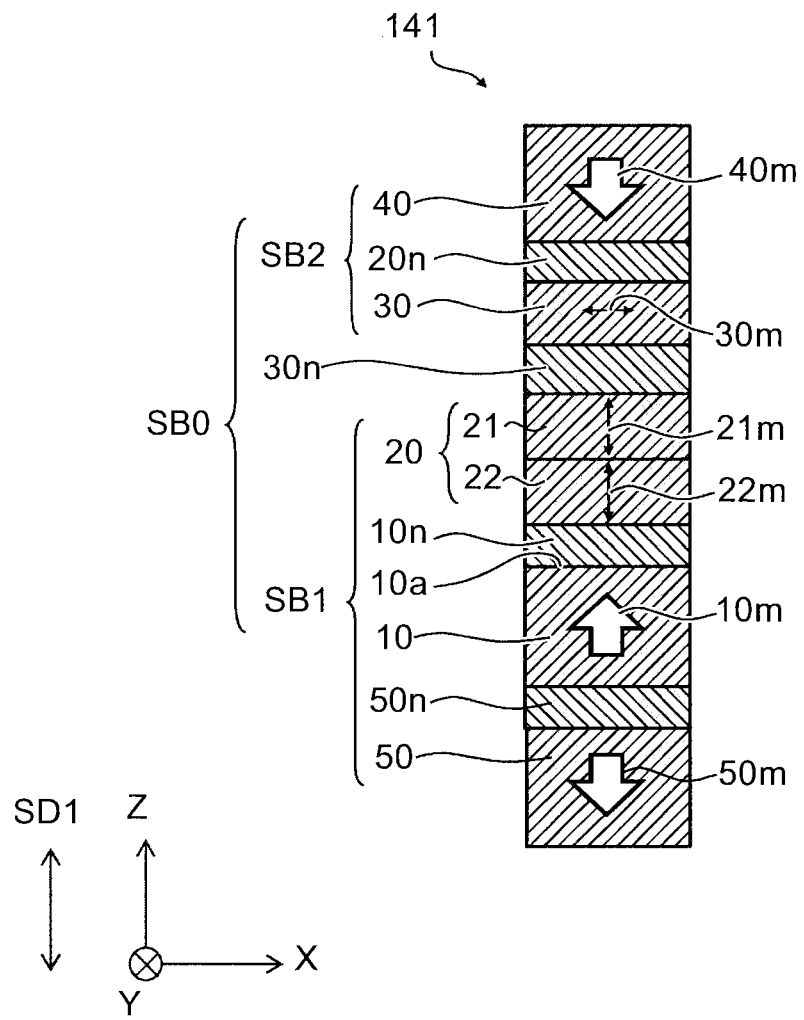
FIG. 23 is a schematic cross-sectional view showing another magnetic memory element according to the first embodiment.

FIG. 23 is a schematic cross-sectional view showing another magnetic memory element according to the first embodiment.

In the magnetic memory element 141 as shown in FIG. 23, the first stacked unit SB1 further includes a fifth ferromagnetic layer 50 and a fifth nonmagnetic layer 50*n*.

In the magnetic memory element 141, the first ferromagnetic layer 10 is provided between the second ferromagnetic layer 20 and the fifth ferromagnetic layer 50. The fifth nonmagnetic layer 50*n* is provided between the first ferromagnetic layer 10 and the fifth ferromagnetic layer 50. In the magnetic memory element 141, the fifth ferromagnetic layer 50, the fifth nonmagnetic layer 50*n*, the first ferromagnetic layer 10, the first nonmagnetic layer 10*n*, the second ferromagnetic layer 20, the third nonmagnetic layer 30*n*, the third ferromagnetic layer 30, the second nonmagnetic layer 20*n*, and the fourth ferromagnetic layer 40 are stacked in this order.

The fifth ferromagnetic layer 50 may include, for example, the material described in regard to the fourth ferromagnetic layer 40. The fifth nonmagnetic layer 50*n* may include, for example, the material described in regard to the third nonmagnetic layer 30*n*.

The orientation of the stacking direction SD1 component of a magnetization 50*m* of the fifth ferromagnetic layer 50 is the reverse of the orientation of the stacking direction SD1 component of the magnetization 10*m* of the first ferromagnetic layer 10. For example, the leakage magnetic field caused by the magnetization 10*m* is weakened by the leakage magnetic field of the reverse orientation caused by the magnetization 50*m*. For example, the leakage magnetic field caused by the magnetization 10*m* is canceled by the leakage magnetic field caused by the magnetization 50*m*. Thereby, the effects of the leakage magnetic field on the second ferromagnetic layer 20 can be suppressed more appropriately.

Figure 24A:
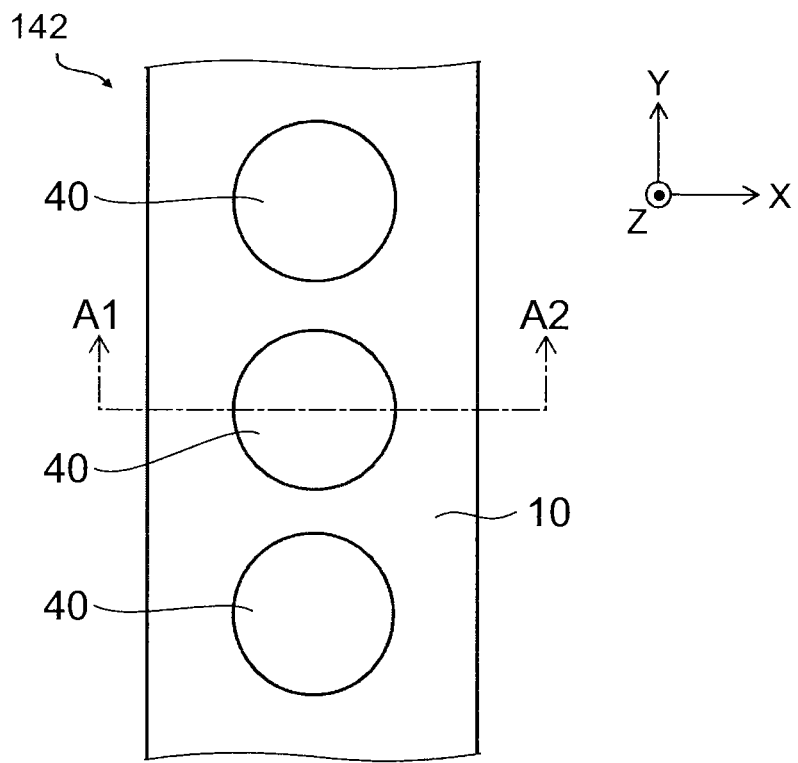
FIGS. 24A and 24B are schematic views showing another magnetic memory element according to the first embodiment.
Figure 24B:
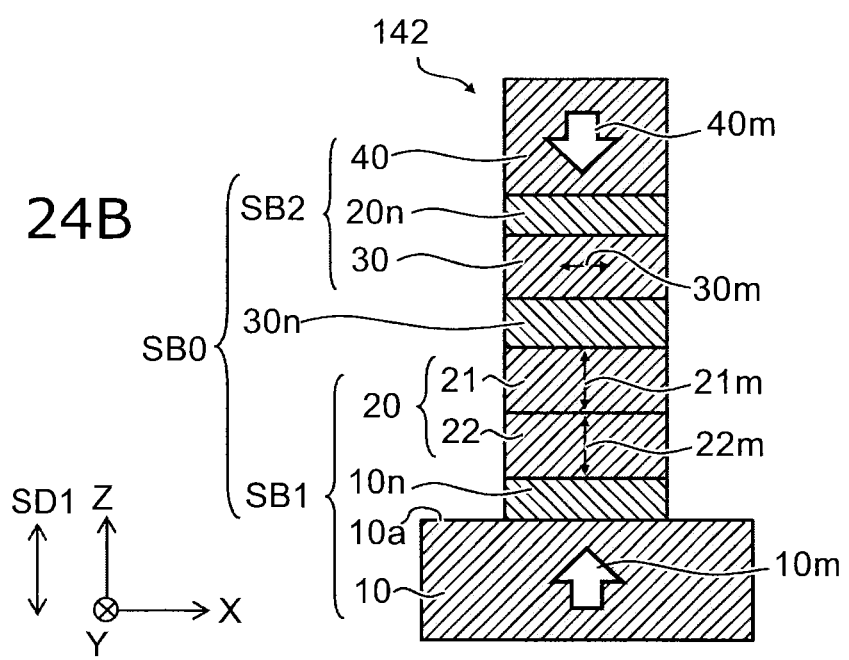

FIGS. 24A and 24B are schematic views showing another magnetic memory element according to the first embodiment.

FIG. 24A is a schematic plan view of the magnetic memory element 142; and FIG. 24B is a schematic cross-sectional view of the magnetic memory element 142. FIG. 24B schematically shows the cross section along line A1-A2 of FIG. 24A.

In the magnetic memory element 142 as shown in FIGS. 24A and 24B, the second ferromagnetic layer 20, the first nonmagnetic layer 10*n*, the second stacked unit SB2, and the third nonmagnetic layer 30*n* are multiply provided. The multiple second ferromagnetic layers 20 are arranged in a direction perpendicular to the stacking direction SD1. In the example, the multiple second ferromagnetic layers 20 are arranged in the Y-axis direction. The multiple first nonmagnetic layers 10*n* are provided respectively between the first ferromagnetic layer 10 and the multiple second ferromagnetic layers 20. The multiple second stacked units SB2 are stacked respectively with the multiple second ferromagnetic layers 20. The multiple third nonmagnetic layers 30*n* are provided respectively between the multiple second ferromagnetic layers 20 and the multiple second stacked units SB2.

In the magnetic memory element 142, the multiple first nonmagnetic layers 10*n* are arranged on the first ferromagnetic layer 10. The multiple second ferromagnetic layers 20 are provided respectively on the multiple first nonmagnetic layers 10*n*. The multiple third nonmagnetic layers 30*n* are provided respectively on the multiple second ferromagnetic layers 20. The multiple second stacked units SB2 are provided respectively on the multiple third nonmagnetic layers 30*n*.

In the magnetic memory element 142, the first ferromagnetic layer 10 is larger than the second ferromagnetic layer 20, the third ferromagnetic layer 30, etc. Thereby, for example, the leakage magnetic field at the position of the second ferromagnetic layer 20 caused by the magnetization 10*m* of the first ferromagnetic layer 10 can be reduced.

Figure 25A:
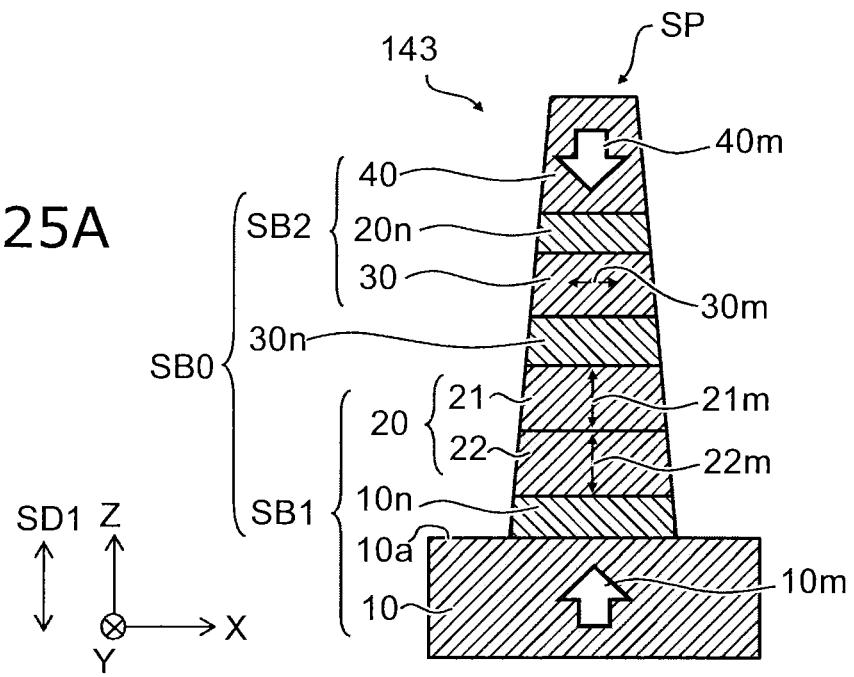
FIGS. 25A and 25B are schematic cross-sectional views showing other magnetic memory elements according to the first embodiment.
Figure 25B:
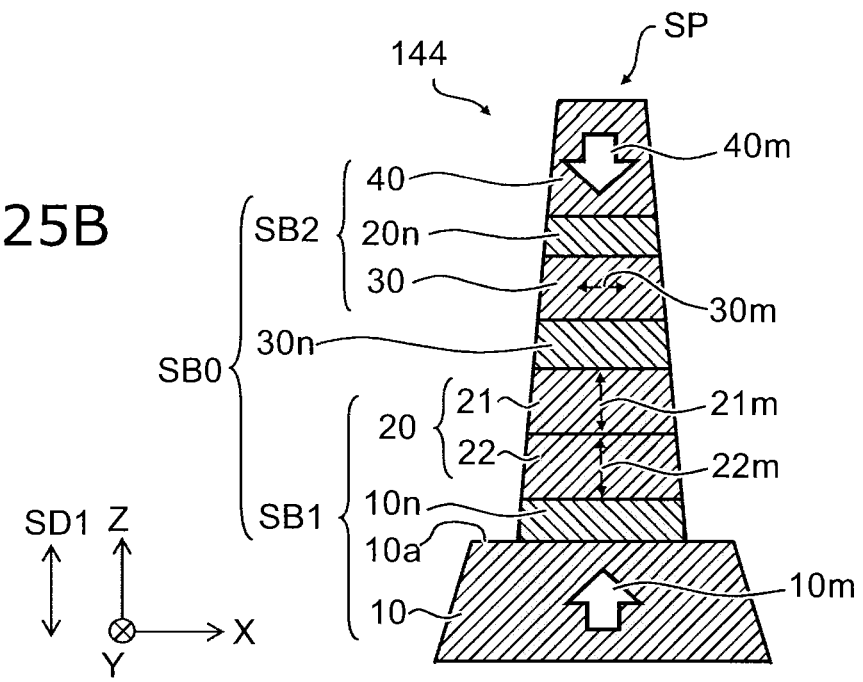

FIGS. 25A and 25B are schematic cross-sectional views showing other magnetic memory elements according to the first embodiment.

In the magnetic memory element 143 as shown in FIG. 25A, the width (the length in the direction perpendicular to the stacking direction SD1) of a stacked portion SP decreases in the direction from the first stacked unit SB1 toward the second stacked unit SB2. For example, the width of the stacked portion SP decreases continuously.

The stacked portion SP includes, for example, one of the multiple second ferromagnetic layers 20, one first nonmagnetic layer 10*n* stacked with the one second ferromagnetic layer 20, one second stacked unit SB2 stacked with the one second ferromagnetic layer 20, and one third nonmagnetic layer 30*n* stacked with the one second ferromagnetic layer 20.

In the example, the width of the stacked portion SP decreases continuously in the upward direction. In other words, the stacked portion SP has a tapered configuration. The stacked portion SP has, for example, a truncated pyramid configuration. The configurations of the second ferromagnetic layer 20, etc., projected onto the X-Y plane are, for example, circles. Accordingly, the stacked portion SP has, for example, a truncated circular conical configuration. Accordingly, in the example, the length of each of the multiple second stacked units SB2 in the direction perpendicular to the stacking direction SD1 is shorter than the length of each of the multiple second ferromagnetic layers 20 in the direction perpendicular to the stacking direction SD1. For example, the length of the third ferromagnetic layer 30 in the direction perpendicular to the stacking direction SD1 is shorter than the length of the second ferromagnetic layer 20 in the direction perpendicular to the stacking direction SD1.

In the magnetic memory element 143, for example, the fourth ferromagnetic layer 40 can be smaller than that of the magnetic memory element 142, etc. Thereby, for example, the leakage magnetic field at the position of the second ferromagnetic layer 20 caused by the magnetization 40*m* of the fourth ferromagnetic layer 40 can be reduced. Also, in the magnetic memory element 143, for example, the Δ value of the STO can be reduced. Thereby, for example, it is easier to cause the magnetization 30*m* of the third ferromagnetic layer 30 to precess. In the example, the second ferromagnetic layer 20, etc., also have tapered configurations. This is not limited thereto; and it is sufficient for the width of the third ferromagnetic layer 30 to be narrower than the width of the second ferromagnetic layer 20. Thereby, the Δ value of the STO can be small.

In the magnetic memory element 144 as shown in FIG. 25B, the width (the length in the direction perpendicular to the stacking direction SD1) of the first ferromagnetic layer 10 decreases in the direction from the first stacked unit SB1 toward the second stacked unit SB2. For example, the width of the first ferromagnetic layer 10 decreases continuously. In the example, the width of the first ferromagnetic layer 10 decreases continuously in the upward direction. In other words, the first ferromagnetic layer 10 has a tapered configuration. The first ferromagnetic layer 10 has, for example, a truncated pyramid configuration. Thus, the first ferromagnetic layer 10 may have a tapered configuration.

Figures 26A, 26B:
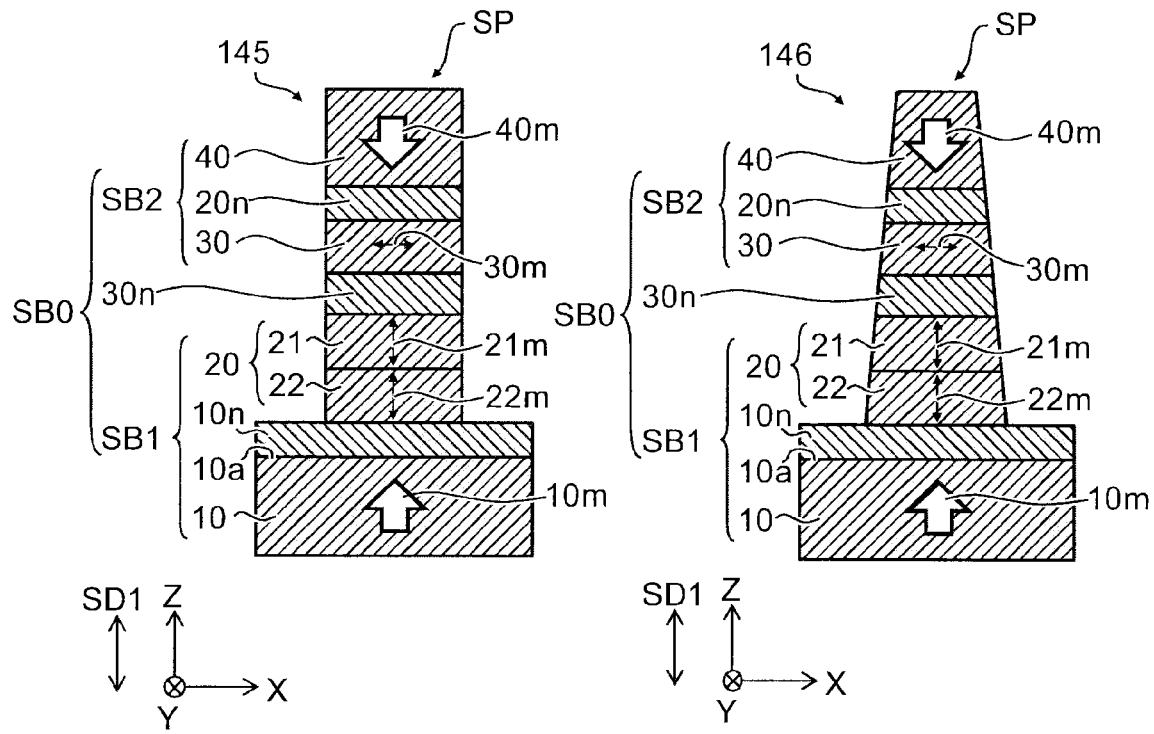
FIGS. 26A to 26C are schematic cross-sectional views showing other magnetic memory elements according to the first embodiment.
Figure 26C:
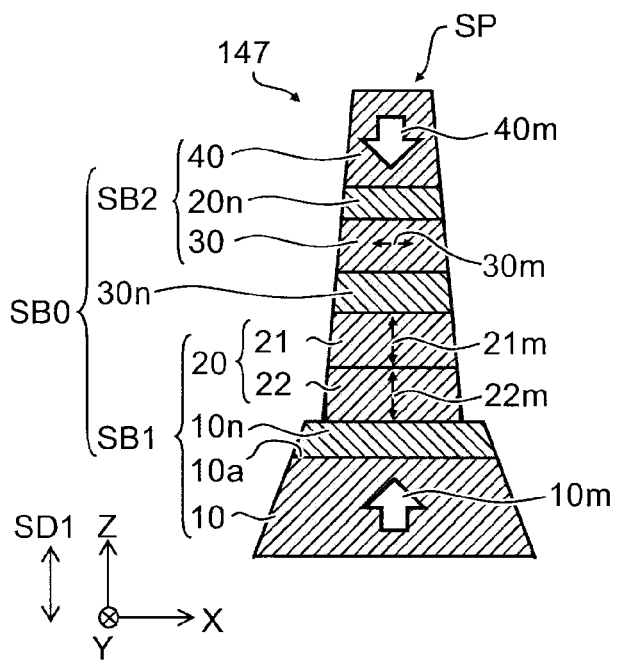

FIGS. 26A to 26C are schematic cross-sectional views showing other magnetic memory elements according to the first embodiment.

In the magnetic memory elements 145 to 147 as shown in FIGS. 26A to 26C, one first nonmagnetic layer 10n is provided between the first ferromagnetic layer 10 and the multiple second ferromagnetic layers 20. In the magnetic memory elements 145 to 147, the first nonmagnetic layer 10n is provided on the first ferromagnetic layer 10. The multiple second ferromagnetic layers 20 are arranged on the first nonmagnetic layer 10n. The multiple third nonmagnetic layers 30n are provided respectively on the multiple second ferromagnetic layers 20. The multiple second stacked units SB2 are provided respectively on the multiple third nonmagnetic layers 30n.

In the magnetic memory elements 145 to 147, the stacked portion SP includes, for example, one of the multiple second ferromagnetic layers 20, one second stacked unit SB2 stacked with the one second ferromagnetic layer 20, and one third nonmagnetic layer 30n stacked with the one second ferromagnetic layer 20.

Thus, in the configuration in which the multiple stacked portions SP are stacked with one first ferromagnetic layer 10, the first nonmagnetic layer 10n may be multiply provided respectively between the first ferromagnetic layer 10 and the multiple second ferromagnetic layers 20; or one first nonmagnetic layer 10n may be provided between the first ferromagnetic layer 10 and the multiple second ferromagnetic layers 20.

In the magnetic memory element 146, the stacked portion SP has a tapered configuration. Thus, in the configuration in which one stacked portion SP is provided, the stacked portion SP may have a tapered configuration.

In the magnetic memory element 147, the width of the first ferromagnetic layer 10 and the width of the first nonmagnetic layer 10n continuously decrease in the direction from the first stacked unit SB1 toward the second stacked unit SB2. Thus, the configuration of the first ferromagnetic layer 10 and the configuration of the first nonmagnetic layer 10n may be tapered configurations.

Second Embodiment

Figure 27:
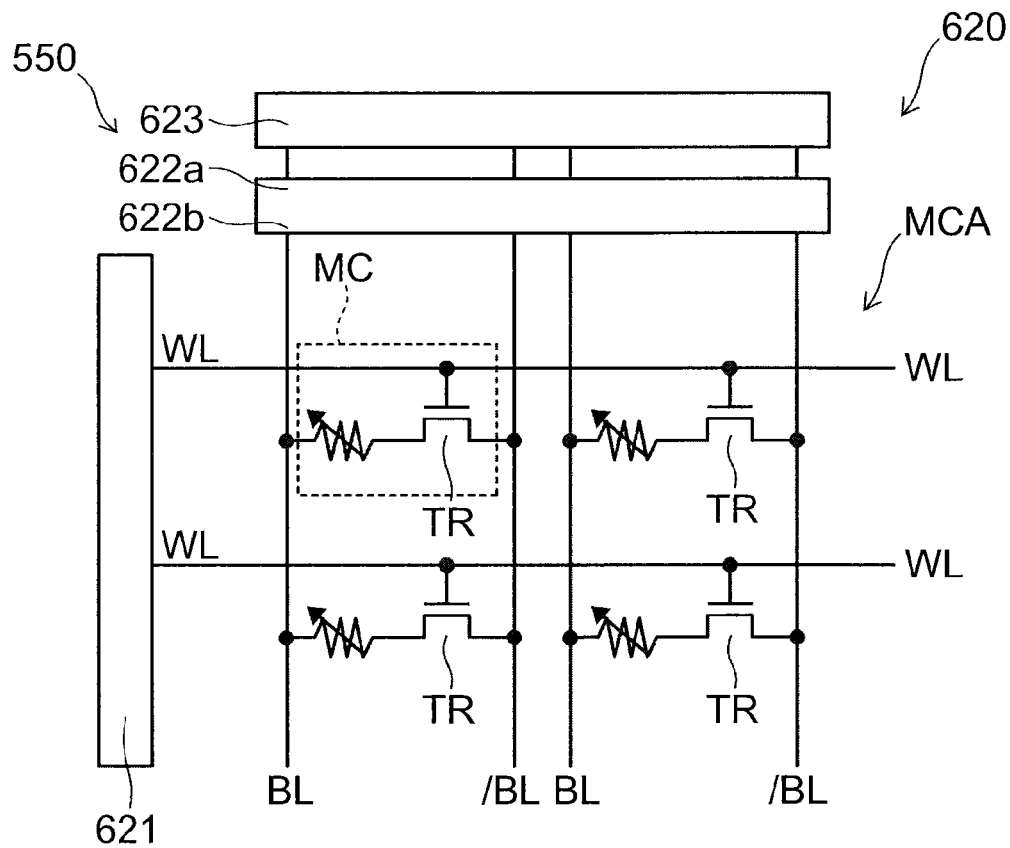
FIG. 27 is a schematic view showing the configuration of a nonvolatile memory device according to a second embodiment.

FIG. 27 is a schematic view showing the configuration of a nonvolatile memory device according to a second embodiment.

As shown in FIG. 27, the nonvolatile memory device 620 according to the embodiment includes a memory cell array MCA. The memory cell array MCA includes multiple memory cells MC arranged in a matrix configuration. Each of the memory cells MC includes one selected from the magnetic memory elements according to the first embodiment as a MTJ element (the stacked body SB0).

Multiple bit line pairs (bit lines BL and bit lines bar-BL) and multiple word lines WL are disposed in the memory cell array MCA. Each of the multiple bit line pairs extends in a column direction. Each of the multiple word lines WL extends in a row direction.

The memory cells MC are disposed at the intersections between the bit lines BL and the word lines WL. Each of the memory cells MC includes a MTJ element and a selection transistor TR. One end of the MTJ element is connected to the bit line BL. The other end of the MTJ element is connected to the drain terminal of the selection transistor TR. The gate terminal of the selection transistor TR is connected to the word line WL. The source terminal of the selection transistor TR is connected to the bit line bar-BL.

A row decoder 621 is connected to the word lines WL. A write circuit 622a and a read-out circuit 622b are connected to the bit line pairs (the bit lines BL and the bit lines bar-BL). A column decoder 623 is connected to the write circuit 622a and the read-out circuit 622b.

Each of the memory cells MC is selected by the row decoder 621 and the column decoder 623. An example of the data writing to the memory cells MC is as follows. First, the word line WL that is connected to the memory cell MC for which the data writing is to be performed is activated to select the memory cell MC. Thereby, the selection transistor TR is switched ON.

In the example, for example, the control unit 550 includes the row decoder 621, the write circuit 622a, the read-out circuit 622b, and the column decoder 623. The control unit 550 is electrically connected to each of the multiple memory cells MC (the multiple magnetic memory elements) via the bit line BL, the word line WL, the selection transistors TR, etc. The control unit 550 implements the writing of the data and the reading of the data for each of the multiple memory cells MC.

For example, the writing current is supplied to the MTJ element in two directions. Specifically, in the case where the writing current is supplied to the MTJ element from the left to the right, the write circuit 622a applies a positive potential to the bit line BL and applies a ground potential to the bit line bar-BL. Further, in the case where the writing current is supplied to the MTJ element from the right to the left, the write circuit 622a applies the positive potential to the bit line bar-BL and applies the ground potential to the bit line BL. Thus, the datum of "0" or the datum of "1" can be written to the memory cell MC.

An example of the data read out from the memory cell MC is as follows. First, the memory cell MC is selected. The read-out circuit 622b supplies the MTJ element with, for example, the read-out current flowing in the direction from the selection transistor TR toward the MTJ element. Then, the read-out circuit 622b senses the resistance value of the MTJ element based on the read-out current. Thus, the information that is stored in the MTJ element can be read.

Figure 28:
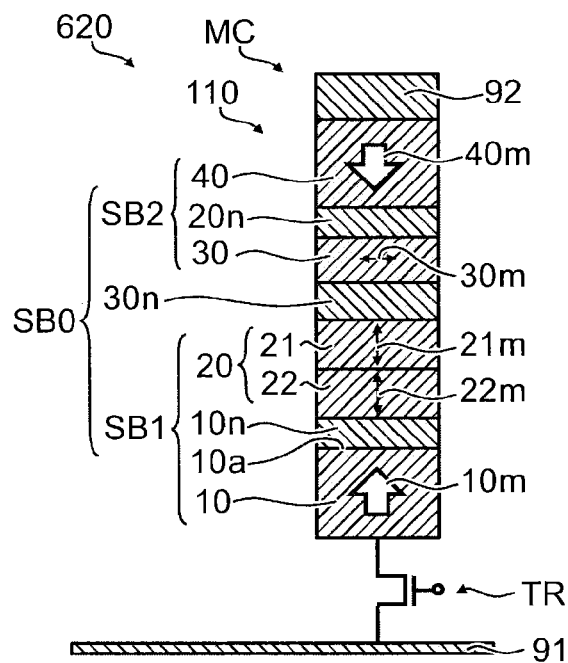
FIG. 28 is a schematic view showing the configuration of a nonvolatile memory device according to the second embodiment.

FIG. 28 is a schematic view showing the configuration of a nonvolatile memory device according to the second embodiment.

FIG. 28 shows a portion of one memory cell MC. Although the magnetic memory element 110 is used in the example, any magnetic memory element according to the embodiment may be used.

As shown in FIG. 28, the nonvolatile memory device 620 includes a magnetic memory element (e.g., the magnetic memory element 110) according to the embodiment, the first interconnect 91, and the second interconnect 92. The first interconnect 91 is connected directly or indirectly to one end of the magnetic memory element 110 (e.g., an end of the first stacked unit SB1). The second interconnect 92 is connected directly or indirectly to the other end of the magnetic memory element 110 (e.g., an end of the second stacked unit SB2).

Herein, being "connected directly to" includes the state of being electrically connected without another conductive member (e.g., a via electrode, an interconnect, etc.) inserted therebetween. Being "connected indirectly to" includes the state of being electrically connected with another conductive member (e.g., a via electrode, an interconnect, etc.) inserted therebetween and the state of being connected in which a switch (e.g., a transistor, etc.) inserted therebetween can form a state in which conduction and non-conduction are changeable.

One selected from the first interconnect 91 and the second interconnect 92 corresponds to, for example, the word line WL.

The other selected from the first interconnect 91 and the second interconnect 92 corresponds to, for example, the bit line BL or the bit line bar-BL.

As shown in FIG. 28, the nonvolatile memory device 620 may further include the selection transistor TR. The selection transistor TR is provided between the magnetic memory element 110 and the first interconnect 91 (a first position) and/or between the magnetic memory element 110 and the second interconnect 92 (a second position).

By such a configuration, data can be written to any memory cell MC (e.g., the magnetic memory element 110) of the memory cell array MCA; and the data that is written to the magnetic memory element 110 can be read. In the nonvolatile memory device 620 having such a configuration as well, misoperations can be suppressed by providing the trigger layer in the second ferromagnetic layer 20.

According to the embodiments, a magnetic memory element and a nonvolatile memory device in which misoperations are suppressed are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in the magnetic memory element and the nonvolatile memory device such as the control unit, the stacked body, the first and second stacked units, the first to fifth ferromagnetic layers, the first to fifth nonmagnetic layers, the magnetic shield, the first interconnect, the second interconnect, the selection transistor, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all magnetic memory elements and nonvolatile memory devices practicable by an appropriate design modification by one skilled in the art based on the magnetic memory elements and the nonvolatile memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element, comprising:
a first stacked unit including
a first ferromagnetic layer having a fixed direction of magnetization,
a second ferromagnetic layer stacked with the first ferromagnetic layer, the second ferromagnetic layer having
a first portion having a changeable direction of magnetization, and
a second portion stacked with the first portion in a stacking direction of the first ferromagnetic layer and the second ferromagnetic layer, the second portion having a changeable direction of magnetization, a magnetic resonance frequency of the second portion being lower than a magnetic resonance frequency of the first portion, and
a first nonmagnetic layer provided between the first ferromagnetic layer and the second ferromagnetic layer; and
a second stacked unit stacked with the first stacked unit in the stacking direction, the second stacked unit including a third ferromagnetic layer having a changeable direction of magnetization,
a rotating magnetic field being generated by a precession of the magnetization of the third ferromagnetic layer when a current flows in the first stacked unit and the second stacked unit in one of a direction from the first stacked unit toward the second stacked unit and a direction from the second stacked unit toward the first stacked unit,
the direction of the magnetization of the first portion and the direction of the magnetization of the second portion being oriented in a direction corresponding to an orientation of the current due to actions of the rotating magnetic field and spin-polarized electrons.

2. The element according to claim 1, wherein
the magnetic resonance frequency of the first portion is not less than 20 GHz, and
the magnetic resonance frequency of the second portion is less than 20 GHz.

3. The element according to claim 1, wherein
the magnetic resonance frequency of the first portion is not less than 20 GHz, and
the magnetic resonance frequency of the second portion is less than 15 GHz.

4. The element according to claim 1, wherein the second stacked unit further includes:

a fourth ferromagnetic layer stacked with the third ferromagnetic layer in the stacking direction, the fourth ferromagnetic layer having a fixed direction of magnetization; and a second nonmagnetic layer provided between the third ferromagnetic layer and the fourth ferromagnetic layer.

5. The element according to claim 4, wherein an orientation of a component in the stacking direction of the magnetization of the first ferromagnetic layer is the reverse of an orientation of a component in the stacking direction of the magnetization of the fourth ferromagnetic layer.

6. The element according to claim 1, further comprising a third nonmagnetic layer provided between the first stacked unit and the second stacked unit, the third nonmagnetic layer including one metal selected from the group consisting of ruthenium (Ru), tantalum (Ta), tungsten (W), platinum (Pt), palladium (Pd), molybdenum (Mo), niobium (Nb), zirconium (Zr), titanium (Ti), osmium (Os), iridium (Ir), and vanadium (V) or an alloy including at least two metals selected from the group.

7. The element according to claim 1, further comprising a third nonmagnetic layer provided between the first stacked unit and the second stacked unit, the third nonmagnetic layer including one metal selected from the group consisting of ruthenium (Ru), osmium (Os), and iridium (Ir) or an alloy including at least two metals selected from the group, a thickness of the third nonmagnetic layer being not more than 3 nanometers.

8. The element according to claim 1, wherein the second ferromagnetic layer further includes a fourth nonmagnetic layer provided between the first portion and the second portion, and the fourth nonmagnetic layer includes one metal selected from the group consisting of ruthenium (Ru), osmium (Os), and iridium (Ir) or an alloy including at least two metals selected from the group.

9. The element according to claim 1, wherein a perpendicular magnetization component parallel to the stacking direction of the magnetization of the first ferromagnetic layer is larger than an in-plane magnetization component perpendicular to the stacking direction of the magnetization of the first ferromagnetic layer, the perpendicular magnetization component of the magnetization of the first portion is larger than the in-plane magnetization component of the magnetization of the first portion, the perpendicular magnetization component of the magnetization of the second portion is larger than the in-plane magnetization component of the magnetization of the second portion, and the perpendicular magnetization component of the magnetization of the third ferromagnetic layer is less than the in-plane magnetization component of the magnetization of the third ferromagnetic layer.

10. The element according to claim 1, wherein a length of the third ferromagnetic layer in an in-plane direction perpendicular to the stacking direction is not more than 35 nanometers, and a length of the third ferromagnetic layer of the stacking direction is not less than 0.5 nanometers and not more than 3.5 nanometers.

11. The element according to claim 1, further comprising a magnetic shield, the first stacked unit having a first side surface extending in the stacking direction, the second stacked unit having a second side surface extending in the stacking direction, the magnetic shield opposing at least a portion of the first side surface and the second side surface.

12. The element according to claim 1, wherein the first stacked unit further includes:

a fifth ferromagnetic layer having a fixed direction of magnetization; and a fifth nonmagnetic layer, the first ferromagnetic layer is disposed between the second ferromagnetic layer and the fifth ferromagnetic layer, the fifth nonmagnetic layer is disposed between the first ferromagnetic layer and the fifth ferromagnetic layer, and an orientation of a component in the stacking direction of the magnetization of the fifth ferromagnetic layer is the reverse of an orientation of a component in the stacking direction of the magnetization of the first ferromagnetic layer.

13. The element according to claim 1, wherein a plurality of the second ferromagnetic layers, a plurality of the first nonmagnetic layers, and a plurality of the second stacked units are provided, the plurality of second ferromagnetic layers is arranged in an in-plane direction perpendicular to the stacking direction, the plurality of first nonmagnetic layers is disposed respectively between the first ferromagnetic layer and the plurality of second ferromagnetic layers, the plurality of second stacked units are stacked respectively with the plurality of second ferromagnetic layers, and a length of each of the plurality of second stacked units in the in-plane direction is shorter than a length of each of the plurality of second ferromagnetic layers in the in-plane direction.

14. The element according to claim 1, wherein a length of the second stacked unit in an in-plane direction perpendicular to the stacking direction is shorter than a length of the second ferromagnetic layer in the in-plane direction.

15. The element according to claim 1, wherein a length of the first ferromagnetic layer in an in-plane direction perpendicular to the stacking direction decreases in a direction from the first stacked unit toward the second stacked unit.

16. The element according to claim 1, wherein a plurality of the second ferromagnetic layers and a plurality of the second stacked units are provided, the plurality of second ferromagnetic layers is arranged in an in-plane direction perpendicular to the stacking direction, the first nonmagnetic layer is disposed between the first ferromagnetic layer and the plurality of second ferromagnetic layers, and the plurality of second stacked units are stacked respectively with the plurality of second ferromagnetic layers.

17. A nonvolatile memory device, comprising:

a magnetic memory element including a first stacked unit including a first ferromagnetic layer having a fixed direction of magnetization, a second ferromagnetic layer stacked with the first ferromagnetic layer, the second ferromagnetic layer having a first portion having a changeable direction of magnetization, and a second portion stacked with the first portion in a stacking direction of the first ferromagnetic layer and the second ferromagnetic layer, the second portion having a changeable direction of magnetization, a magnetic resonance frequency of the second portion being lower than a magnetic resonance frequency of the first portion, and a first nonmagnetic layer provided between the first ferromagnetic layer and the second ferromagnetic layer, and a second stacked unit stacked with the first stacked unit in the stacking direction, the second stacked unit including a third ferromagnetic layer having a changeable direction of magnetization, a rotating magnetic field being generated by a precession of the magnetization of the third ferromagnetic layer when a current flows in the first stacked unit and the second stacked unit in one of a direction from the first stacked unit toward the second stacked unit and a direction from the second stacked unit toward the first stacked unit, the direction of the magnetization of the first portion and the direction of the magnetization of the second portion being oriented in a direction corresponding to an orientation of the current due to actions of the rotating magnetic field and spin-polarized electrons;

a first interconnect electrically connected to one end of the magnetic memory element;

a second interconnect electrically connected to one other end of the magnetic memory element; and a control unit electrically connected to the magnetic memory element via the first interconnect and the second interconnect, the control unit being configured to set a time to supply the current to the magnetic memory element in a writing operation to change the direction of the magnetization of the first portion and the direction of the magnetization of the second portion to be longer than a time to supply the current to the magnetic memory element in a read-out operation to read the direction of the magnetization of the first portion and the direction of the magnetization of the second portion.

18. The device according to claim 17, further comprising a selection transistor provided between the magnetic memory element and the first interconnect and/or between the magnetic memory element and the second interconnect.

19. The device according to claim 17, wherein the control unit is configured to supply the current to the magnetic memory element for not less than 10 nanoseconds in the writing operation and supply the current to the magnetic memory element for not more than 3 nanoseconds in the read-out operation.

20. The device according to claim 17, wherein the control unit is configured to supply the current to the magnetic memory element for not less than 3 nanoseconds in the writing operation and supply the current to the magnetic memory element for not more than 1 nanosecond in the read-out operation.

* * * * *